(12) United States Patent
Wang et al.

(10) Patent No.: US 10,585,846 B2
(45) Date of Patent: Mar. 10, 2020

(54) MULTI-DIRECTION CONNECTABLE ELECTRONIC MODULE AND MODULAR ELECTRONIC BUILDING SYSTEM

(71) Applicants: Microduino Inc., Westlake Village, CA (US); Meike Technology (Beijing) Ltd., Beijing (CN)

(72) Inventors: Zhenshan Wang, Beijing (CN); Kejia Pan, Beijing (CN); Bin Feng, Beijing (CN); Xi Li, Beijing (CN)

(73) Assignees: MICRODUINO INC., Westlake Village, CA (US); MEIKE TECHNOLOGY (BEIJING) LTD., Beijing (CN)

( * ) Notice: Subject to any disclaimer, the term of this patent is extended or adjusted under 35 U.S.C. 154(b) by 0 days.

(21) Appl. No.: 16/021,990

(22) Filed: Jun. 28, 2018

(65) Prior Publication Data
US 2019/0042530 A1    Feb. 7, 2019

(30) Foreign Application Priority Data

Jun. 30, 2017 (CN) .......................... 2017 1 0518802

(51) Int. Cl.
| | |
|---|---|
| *G06F 15/78* | (2006.01) |
| *A63H 33/04* | (2006.01) |
| *A63H 33/26* | (2006.01) |
| *G06F 1/16* | (2006.01) |
| *H03M 1/66* | (2006.01) |
| *H03M 1/12* | (2006.01) |

(52) U.S. Cl.
CPC ........ *G06F 15/7803* (2013.01); *G06F 1/1698* (2013.01); *H03M 1/12* (2013.01); *H03M 1/66* (2013.01); *A63H 33/04* (2013.01); *A63H 33/26* (2013.01); *G06F 2200/1635* (2013.01)

(58) Field of Classification Search
CPC ......... H01L 2924/00; H01L 2924/0014; H01L 25/0657; H01L 25/0655
USPC ........................................................ 361/735
See application file for complete search history.

(56) References Cited

U.S. PATENT DOCUMENTS

| | | | | |
|---|---|---|---|---|
| 6,129,605 A | * | 10/2000 | Cyrus ................ | A63H 33/04 446/108 |
| 8,491,312 B2 | * | 7/2013 | Rudisill ............. | H01R 11/30 439/39 |

(Continued)

*Primary Examiner* — Brian T Misiura
(74) *Attorney, Agent, or Firm* — Anova Law Group, PLLC

(57) ABSTRACT

A multi-direction connectable electronic module includes a circuit board, including a top surface, a bottom surface, and at least one side; and a plurality of connectors connected to the circuit board, each including a lateral magnetic connector, a shell, a longitudinal inter-locking part, and a lateral inter-locking part. The lateral inter-locking part is configured to connect with a first electronic building block along the lateral direction. The longitudinal inter-locking part is configured to stack with a second electronic building block along the longitudinal direction. The lateral magnetic connector is configured to magnetically connect with the first electronic building block. A plurality of through holes are formed on the shell. A lateral pin connector disposed on the at least one side of the circuit board includes a plurality of pins located at positions corresponding to the plurality of through holes, and is configured to electrically connect the first electronic building block.

20 Claims, 29 Drawing Sheets

(56) References Cited

U.S. PATENT DOCUMENTS

| | | | | |
|---|---|---|---|---|
| 8,753,164 B2* | 6/2014 | Hansen | A63H 33/042 446/85 |
| 8,851,953 B2* | 10/2014 | Oschuetz | A63H 33/042 446/91 |
| 9,177,246 B2* | 11/2015 | Buibas | G06N 3/08 |
| 9,320,980 B2* | 4/2016 | Schweikardt | A63H 33/04 |
| 9,597,607 B2* | 3/2017 | Bdeir | H01R 13/6205 |
| 9,755,356 B1* | 9/2017 | Kim | H01R 13/6205 |
| 9,801,300 B2* | 10/2017 | Wang | H05K 7/1435 |
| 9,980,405 B2* | 5/2018 | Hu | H05K 7/023 |
| 2011/0021107 A1* | 1/2011 | Nag | A63H 33/042 446/91 |
| 2012/0122059 A1* | 5/2012 | Schweikardt | A63H 33/04 434/118 |
| 2012/0218211 A1* | 8/2012 | McRae | G06F 1/1656 345/173 |
| 2017/0036132 A1* | 2/2017 | Yang | A63H 33/042 |
| 2018/0221782 A1* | 8/2018 | Almog | A63H 33/046 |
| 2019/0042530 A1* | 2/2019 | Wang | G06F 15/7803 |

* cited by examiner

MULTI-DIRECTION CONNECTABLE ELECTRONIC MODULE AND MODULAR ELECTRONIC BUILDING SYSTEM

CROSS-REFERENCES TO RELATED APPLICATIONS

This application claims the priority of Chinese Patent Application No. CN201710518802.5, filed on Jun. 30, 2017, the entire content of which is incorporated herein by reference.

FIELD OF THE DISCLOSURE

The present disclosure generally relates to the field of electronics and, more particularly, relates to a multi-direction connectable electronic module and a modular electronic building system.

BACKGROUND

Today, technical devices are widely used in the daily life of people of all ages. However, most people do not know how these electronic devices work, nor do they know how to assemble the devices in the way they want. In fact, there is a big gap between the knowledge of an ordinary person and the knowledge related to the devices used and consumed by the person. Therefore, an ordinary people may not be able to design or construct electronic devices. Currently, the electronic devices available on the market have different specifications, and components with different functions do not match with each other in many cases. In addition, electronic modules that can match with each other are usually connected together through a single way, limiting the space for expansion.

The disclosed multi-direction connectable electronic module and modular electronic building system are directed to solve one or more problems set forth above and other problems in the art.

BRIEF SUMMARY OF THE DISCLOSURE

One aspect of the present disclosure provides a multi-direction connectable electronic module. The multi-direction connectable electronic module includes a circuit board, including a top surface, a bottom surface, and at least one side between the top surface and the bottom surface; and a plurality of connectors, connected to the at least one side of the circuit board and each including a lateral magnetic connector, a shell, a longitudinal inter-locking part, and a lateral inter-locking part. The lateral inter-locking part includes a protruding structure and a recessed structure located on an outer side surface of the shell, and is configured to connect with a first electronic building block along a lateral direction. The longitudinal inter-locking part includes a top inter-locking structure protruding from a top surface of the shell and a bottom inter-locking structure recessed into a bottom surface of the shell, and is configured to connect with a second electronic building block that is stacked longitudinally on a top or a bottom of the electronic module. The lateral magnetic connector is disposed in the shell and configured to magnetically connect with the first electronic building block along the lateral direction. A plurality of through holes are formed on an outer side surface of the shell. A lateral pin connector is disposed on the at least one side of the circuit board. The lateral pin connector includes a plurality of pins located at positions corresponding to the plurality of through holes, and is configured to electrically connect the first electronic building block along the lateral direction.

Another aspect of the present disclosure provides a modular electronic building system. The modular electronic building system includes a multi-direction connectable electronic module and at least one first electronic building block. The multi-direction connectable electronic module includes a circuit board, including a top surface, a bottom surface, and at least one side between the top surface and the bottom surface; and a plurality of connectors, connected to the at least one side of the circuit board and each including a lateral magnetic connector, a shell, a longitudinal inter-locking part, and a lateral inter-locking part. The lateral inter-locking part includes a protruding structure and a recessed structure located on an outer side surface of the shell, and is configured to connect with a first electronic building block along a lateral direction. The longitudinal inter-locking part includes a top inter-locking structure protruding from a top surface of the shell and a bottom inter-locking structure recessed into a bottom surface of the shell, and is configured to connect with a second electronic building block that is stacked longitudinally on a top or a bottom of the electronic module. The lateral magnetic connector is disposed in the shell and configured to magnetically connect with the first electronic building block along the lateral direction. A plurality of through holes are formed on an outer side surface of the shell. A lateral pin connector is disposed on the at least one side of the circuit board. The lateral pin connector includes a plurality of pins located at positions corresponding to the plurality of through holes, and is configured to electrically connect the first electronic building block along the lateral direction. Each first electronic building block is connected to a connector of the multi-direction connectable electronic module along the lateral direction, and includes a first lateral inter-locking part, a first magnet, and a first lateral pin connector. The first lateral inter-locking part is configured to interlock with the lateral inter-locking part of the multi-direction connectable electronic module; the first magnet has a magnetic polarity opposite to a surface magnetic polarity of the lateral magnetic connector of the multi-direction connectable electronic module; and the first lateral pin connector is configured to interlock with the lateral pin connector of the multi-direction connectable electronic module.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

Figure 1:
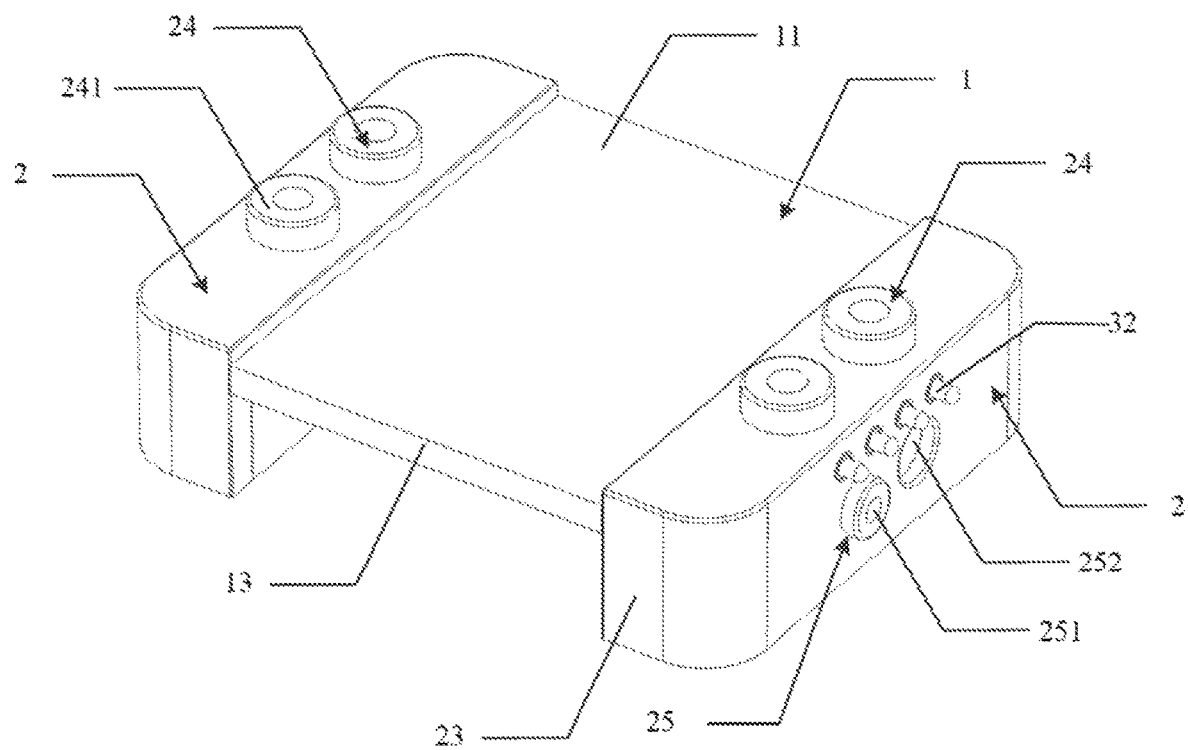
FIG. 1 illustrates a schematic three-dimensional diagram of an exemplary multi-direction connectable electronic module consistent with some embodiments of the present disclosure.

The corresponding references of the components shown in the above drawings include: circuit board 1, top surface 11, bottom surface 12, side 13, connector 2, longitudinal magnetic connector 21, lateral magnetic connector 22, shell 23, longitudinal inter-locking part 24, top inter-locking structure 241, bottom inter-locking structure 242, lateral inter-locking part 25, protruding structure 251, recessed structure 252, longitudinal pin connector 31, lateral pin connector 32, vertically-stacked electronic building block 800, and laterally-connected electronic building block 900.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The present disclosure provides a multi-direction connectable electronic module and a modular electronic building system. The electronic module according to the present disclosure may also be referred to as a module or an electronic building block. The phrase, multi-direction connectable, may refer to that the electronic module may be used to connect other electronic modules or building blocks along multiple directions. For example, the multi-direction connectable electronic module can not only be stacked with building blocks in the longitudinal direction (i.e., the vertical direction) but also be connected to building blocks in the lateral direction (i.e., the horizontal direction). The building blocks that can be connected to the disclosed multi-direction connectable electronic module may be toy building blocks or electronic building blocks. Moreover, the disclosed multi-direction connectable electronic module can maintain magnetic connection and electrical connection with both the vertically-stacked building blocks and the laterally-connected building blocks.

The multi-direction connectable electronic module provided by the present disclosure may include a circuit board 1 and one or more connectors 2. The circuit board 1 may include a top surface 11, a bottom surface 12, and at least one side 13 located between the top surface 11 and the bottom surface 12. The circuit board 1 may have a rectangular basic shape or an irregular basic shape. The circuit board 1 may include at least one side 13 that can be connected to the corresponding one or more connectors 2. That is, each connector 2 may be connected to a corresponding side 13 of the circuit board 1.

FIGS. 1-5 show schematic three-dimensional diagrams of an exemplary multi-direction connectable electronic module consistent with some embodiments of the present disclosure.

Figure 3:
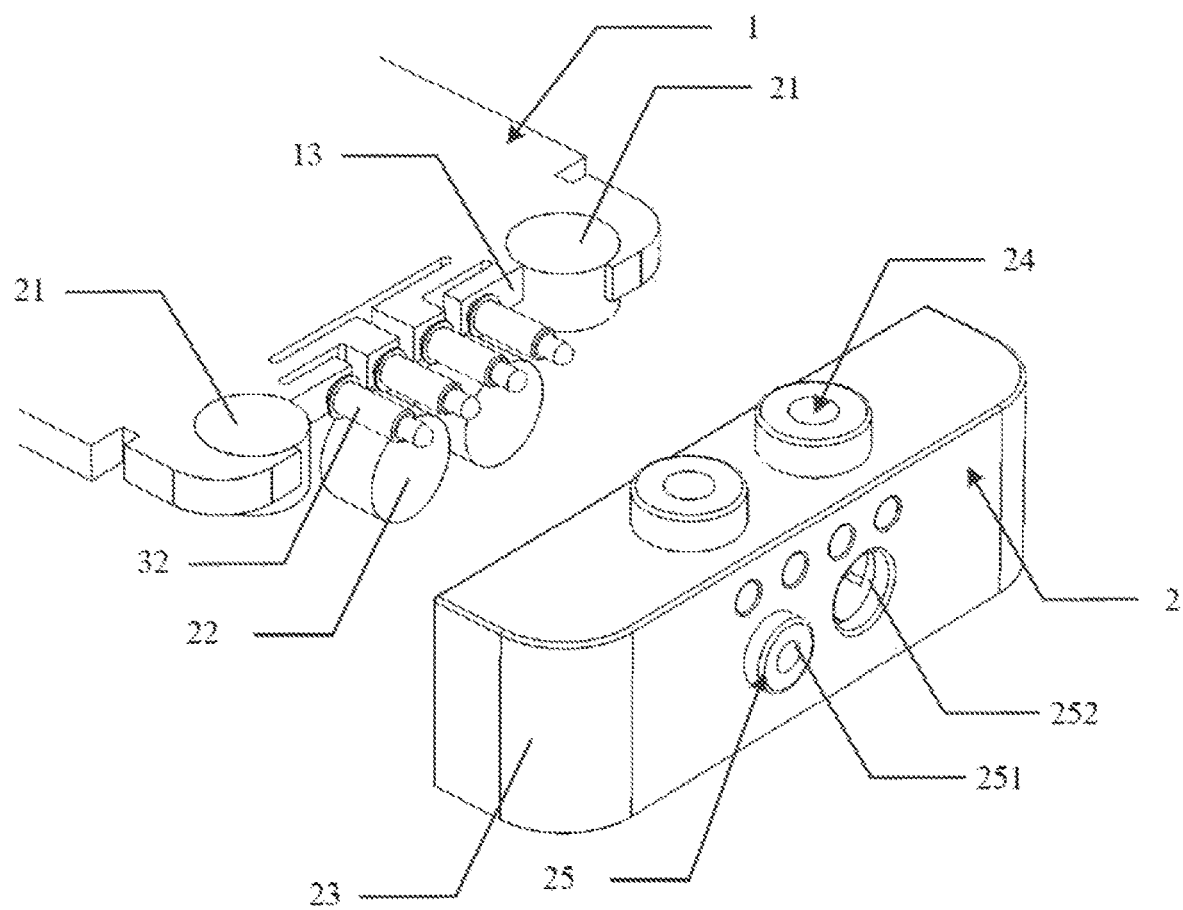
FIG. 3 illustrates a schematic decomposition diagram of a part of the electronic module shown in FIG. 1.

Referring to FIG. 1, in one embodiment, the electronic module may include two connectors 2 connected to two opposite sides 13 of the circuit board 1, respectively. A lateral pin connector 32 including a plurality of pins may be arranged on each side 13 of the circuit board 1. Each connector 2 may include a lateral magnetic connector 22, a shell 23, a longitudinal inter-locking part 24, and a lateral inter-locking part 25. The shell 23 may include a top surface, a bottom surface, and an outer side surface. The top surface of the shell 23 may be parallel to the top surface 11 of the circuit board 1. The outer side surface of the shell 23 may be the side surface facing away from the side 13 of the circuit board 1 that the shell 23 is connected to. The shell 23 may be made of a non-conductive material, such as plastic, rubber, etc. The shape of the shell 23 may be complementary to the shape of the portion of the side 13 that the shell 23 is connected to, such that the circuit board 1 can be fixed and supported. For example, as shown in FIG. 3, the circuit board 1 may include positioning slots and rounded corners corresponding to the side width and the rounded shape of the shell 23 on both ends of the side 13 to fix the shell 23 on the circuit board 1. Moreover, a plurality of through holes, corresponding to the plurality of pins of the lateral pin connector 32, may be arranged on the outer side surface of the shell 23, such that when the connector 2 is connected to the circuit board 1, the plurality of pins of the lateral pin connector 32 may be aligned with the corresponding through holes on the outer side surface of the shell 23.

The longitudinal inter-locking part 24 may be made of a non-conductive material, such as plastic, rubber, etc. The longitudinal inter-locking part 24 may include a top inter-locking structure 241 arranged at the top of the shell 23 and a bottom inter-locking structure 242 arranged at the bottom of the shell 23.

The top inter-locking structure 241 may include a plurality of protruding pillars extending from the top surface of the shell 23. In one embodiment, the top inter-locking structure 241 shown in FIG. 1 may include two circular pillars protruding from the top surface of the shell 23. In other embodiments, the number of the protruding pillars included in the top inter-locking structure may be other than two. In one embodiment, the cross sections of the plurality of protruding pillars may have different shapes. For example, the shapes of the cross sections of the plurality of protruding pillars may include, but are not limited to, circles, ovals, polygons, rectangles, squares, and triangles.

Figure 2:
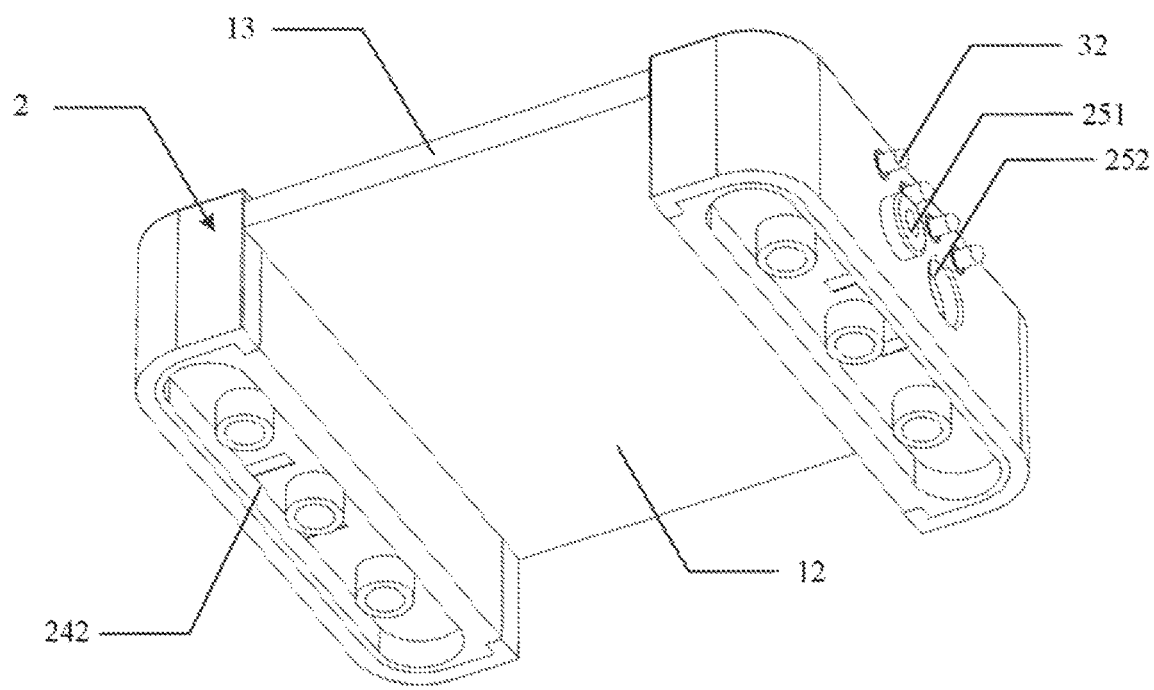
FIG. 2 illustrates another schematic three-dimensional diagram of the electronic module shown in FIG. 1.

The bottom inter-locking structure 242 may include a plurality of groove structures recessed along the depth direction of the shell 23. For example, as shown in FIG. 2, the bottom inter-locking structure 242 may include a track-shaped groove structure. In addition, a plurality of protruding pillars, each having a height equal to the recessed depth, may extend from the bottom surface of the track-shaped groove structure. In some embodiments, the shape of the top inter-locking structure 241 and the shape of the bottom inter-locking structure 242 may be configured to complementarily match with each other. For example, when another building block has a shape the same as the shape of the top inter-locking structure 241 shown in FIG. 1, the building block can be connected to the bottom inter-locking structure 242 of the electronic module. Similarly, when another building block a shape the same as the shape of the bottom inter-locking structure 242 shown in FIG. 1, the building block can be connected to the top inter-locking structure 241 of the electronic module. The other building block that can be vertically stacked with the electronic module may be a functional electronic building block or a toy building block with a matched shape, such as LEGO®.

The lateral inter-locking part 25 may be made of a non-conductive material such as plastic, rubber, etc. The lateral inter-locking part 25 may include a protruding structure 251 and a recessed structure 252 arranged at the outer side surface of the shell 23. In one embodiment, as shown in FIG. 1, the protruding structure 251 is a single circular pillar protruding from the outer side surface of the shell 23. In other embodiments, the protruding structure may include a plurality of protruding pillars, and the cross sections of the plurality of protruding pillars may have different shapes. For example, the shapes of the cross sections of the plurality of protruding pillars may include, but are not limited to, circles, ovals, polygons, rectangles, squares, and triangles.

In one embodiment, as shown in FIG. 1, the recessed structure 252 is a single circular hole opened at the outer side surface of the shell 23. In other embodiments, the recessed structure may include a plurality of holes, and the cross sections of the plurality of holes may have different shapes. For example, the shapes of the cross sections of the plurality of holes may include, but are not limited to, circles, ovals, polygons, rectangles, squares, and triangles.

In some embodiments, the shape of the protruding structure 251 and the shape of the recessed structure 252 may be configured to complementarily match with each other. For example, when another building block has a shape the same as the shape of the protruding structure 251 shown in FIG. 1, the building block can be connected to the recessed structure 252 of the electronic module. Similarly, when another building block has a shape the same as the shape of the recessed structure 252 shown in FIG. 1, the building block can be connected to the protruding structure 251 of the electronic module.

The lateral magnetic connector 22 may include one or more second magnets inserted in the shell 23. All of the second magnets may make the magnetic polarity at the outer side surface of the connector 2 the same as the magnetic polarity at the surfaces of the second magnets that face the shell 23. In one embodiment, as shown in FIG. 3, the lateral magnetic connector 22 may include two cylindrical second magnets. Referring to FIG. 3, although the lateral magnetic connector 22 is inserted in the shell 23 as a part of the connector 2, the two cylindrical second magnets of the lateral magnetic connector 22 may also be connected with the circuit board 1. That is, as a part of the connector 2, the lateral magnetic connector 22 may be connected with the circuit board 1 in the disclosed electronic module. The axis of each cylinder may be along the horizontal direction of the electronic module. For example, the outer side surfaces of the two cylindrical second magnets that face the shell 23 may both be N poles. In other embodiments, the number of second magnets included in the lateral magnetic connector may be other than two. The cross sections of the second magnets may have different shapes. For example, the shapes of the cross sections of the second magnets may include, but are not limited to, circles, ovals, polygons, rectangles, and squares.

In some embodiments, as shown in FIG. 3, the through holes of the shell 23 may be disposed above the lateral inter-locking part 25. The lateral magnetic connector 22 may be disposed at the inner surface of the shell 23 corresponding to the position of the lateral inter-locking part 25. In other embodiments, the through holes of the shell may be arranged below the lateral inter-locking part, or may be arranged to surround the lateral inter-locking part.

In some embodiments, the connector 2 may also include a longitudinal magnetic connector 21 disposed in the shell 23. Both the longitudinal magnetic connector 21 and the lateral magnetic connector 22 may be made of a magnetic material. In one embodiment, the longitudinal magnetic connector 21 may include one or more first magnetic inserted in the shell 23. All of the first magnets may make the magnetic polarity at the top surface of the connector 2 the same as the magnetic polarity at the top surfaces of the first magnets and the magnetic polarity at the bottom surface of the connector 2 the same as the magnetic polarity at the bottom surfaces of the first magnets. FIG. 3 illustrates a longitudinal magnetic connector 21 including two cylindrical first magnets. Referring to FIG. 3, although the longitudinal magnetic connector 21 is inserted in the shell 23 as a part of the connector 2, the two cylindrical first magnets of the longitudinal magnetic connector 21 may also be connected with the circuit board 1. That is, as a part of the connector 2, the longitudinal magnetic connector 21 may be connected with the circuit board 1 in the disclosed electronic module. The axis of each cylinder may be along the longitudinal (vertical) direction of the electronic module. For example, the top surface of each cylindrical magnet may be the N pole and the bottom surface may be the S pole. In other embodiments, the number of the first magnets included in the longitudinal magnetic connector may be other than two. The cross sections of the first magnets may have different shapes. For example, the shapes of the cross sections of the first magnets may include, but are not limited to, circles, ovals, polygons, rectangles, and squares. In some embodiments, as shown in FIG. 3, the plurality of first magnets of the longitudinal magnetic connector 21 may be arranged at both ends of the shell 23, and may be separated by the lateral pin connector 32 and the lateral magnetic connector 22.

When the electronic module is about to be connected to another electronic building block (either through longitudinal stacking or lateral connection), due to the attraction between the different polarities of the magnetic connectors corresponding to the two modules, the two modules can only be magnetically connected in a specific way, i.e. a correct way. According to the design, it is not possible for two modules to be connected in a wrong way (e.g., incorrectly inverting a module in an undesired manner) because the same polarity of two different modules would be mutually exclusive.

In one embodiment, a plurality of metallic pin connectors may be arranged on the circuit board 1, and the plurality of metallic pin connectors may include a plurality longitudinal pin connectors 31 and/or a plurality of lateral pin connectors 32. The metallic pin connectors can be used for current conduction and/or electronic communication between two modules. For example, the plurality of pin connectors may be a plurality of spring pins (i.e., pogo pins or pogo spring pins) used to ensure the connection between the vertically stacked and/or laterally connected modules. Further, other than spring pins, any suitable means for transferring current and communication between modules should be included in the scope of the present disclosure.

The lateral pin connector 32 may be a pogo type or a flat-contact type. That is, the plurality of pins of the lateral pin connector 32 may be pogo pins or flat contacts. The pins of the electronic devices of the circuit board 1 may be electrically connected to the lateral pin connector 32. For example, the corresponding copper-covered surface of the side 13 of the circuit board 1 may be electrically connected with the end of a contact, and the lateral pressure due to the elastic deformation of the printed circuit board (PCB) may ensure a tight connection between the copper-covered surface and the corresponding pogo pin, such that electrical connection between the circuit on the PCB and the pin may be established. Referring to FIGS. 1-3, in one embodiment, the lateral pin connector 32 is a pogo type. As shown in FIG. 1, the pogo type lateral pin connector 32 may pass through the through holes, and the end of each pogo pin of the lateral pin connector 32 may have a convex surface protruding out from the side of the shell 23.

Figure 4:
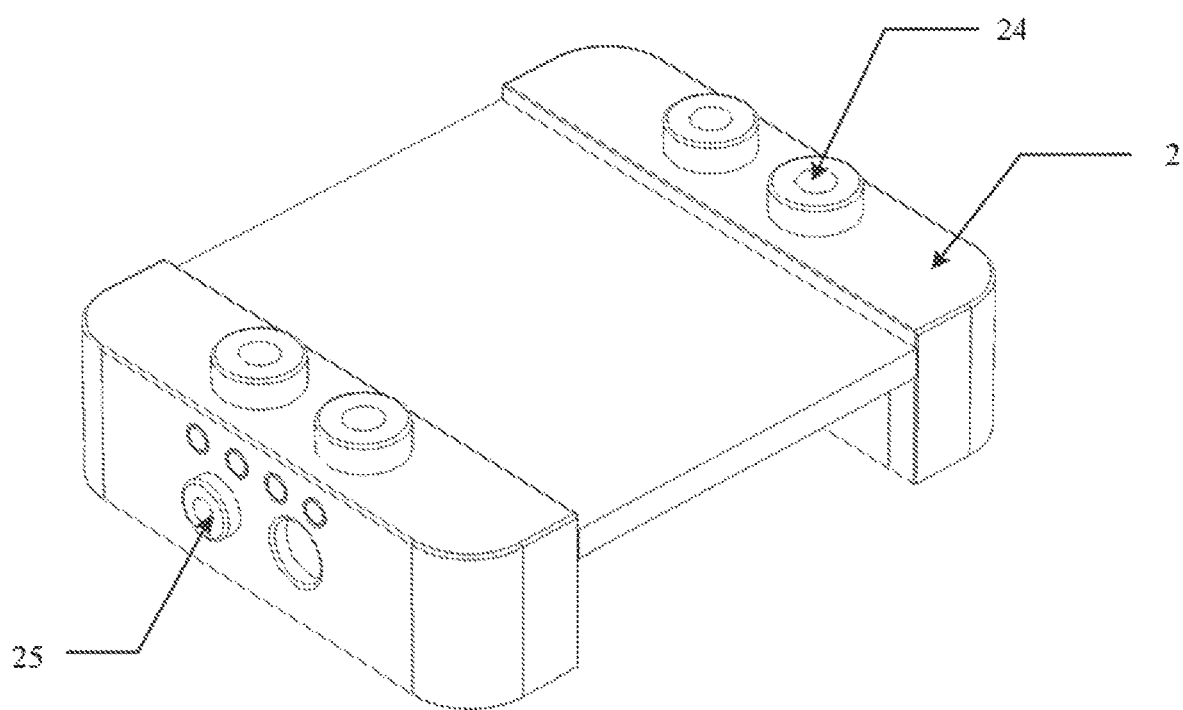
FIG. 4 illustrates another schematic three-dimensional diagram of the multi-direction connectable electronic module shown in FIG. 1.

Referring to FIG. 4, in some other embodiments, the lateral pin connector may be a flat-contact type, and the contacts of the lateral pin connector may be located in the through holes of the shell and may not protrude out the outer side surface.

In one embodiment, the number of through holes arranged on the outer side of the shell 23 may be larger than or equal to the number of the electrical contacts (the contact points) included in the lateral pin connector 32. As shown in FIG. 3, the plurality of pins of the lateral pin connector 32 may be lined up in the horizontal direction. In other embodiments, the plurality of pins of the lateral pin connector may be lined up vertically or may be arranged in a quadrilateral configuration or any other suitable configuration. Each connector 2 may correspond to a set of lateral pin connectors 32. The pogo type and the flat-contact type may be combined as a male-female configuration. That is, in a case that a lateral pin connector 32 corresponding to a connector 2 of an electronic module is a pogo type, when an electronic building block is laterally connected to the pogo type lateral pin connector 32, the lateral pin connector of the electronic building block may be a flat-contact type. The pogo pin and the flat contact may be tightly connected to each other to ensure that the electronic building block is electrically connected to the electronic module.

Figure 5:
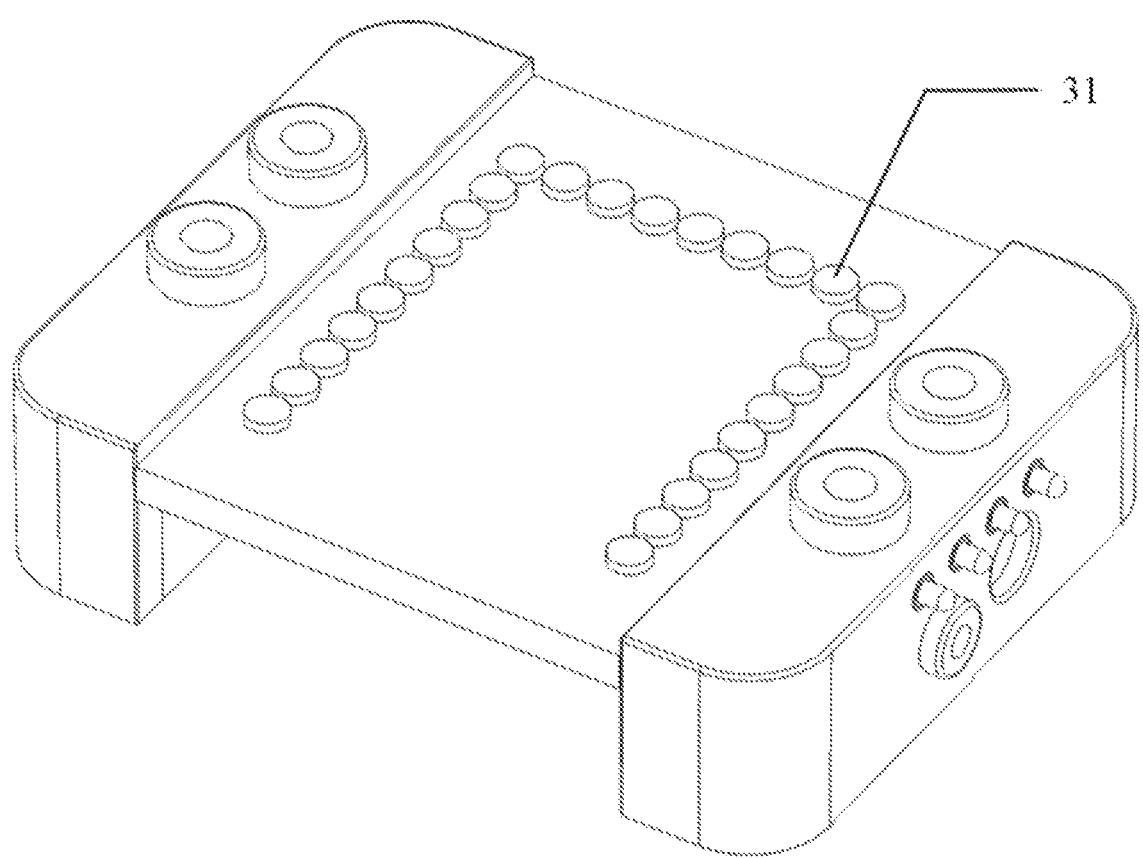
FIG. 5 illustrates a schematic diagram of the electronic module shown in FIG. 1 with a plurality of longitudinal pin connectors disposed on the electronic module.

In some other embodiments, the circuit board may also include a metallic longitudinal pin connector 31. The longitudinal pin connector 31 may be a pogo type or a flat-contact type. The longitudinal pin connector 31 may be arranged on the top surface 11 and/or the bottom surface 12 of the circuit board 1, and may not be in contact with the connector 2. In some embodiments, when the longitudinal pin connector 31 is arranged on both the top surface 11 and the bottom surface 12 of the circuit board 1, the pins of the longitudinal pin connector 31 arranged on one of the two surfaces may be the pogo type and the pins of the longitudinal pin connector 31 arranged on the other of the two surfaces may be the flat-contact type. For example, as shown in FIG. 5, the 27 pins arranged on the top surface 11 of the electronic module may be flat-contact type. When the electronic module is vertically stacked with another electronic building block, the longitudinal pin connector 21 may be electrically connected with the corresponding pogo pins such that electrical conduction between the vertically stacked electronic modules may be achieved. In some embodiments, the pogo pins may include 27 pogo pins arranged in a U shape, or about 44 pogo pins arranged in an H shape. Alternatively, the pogo pins may include about 88 pogo pins arranged in an H shape. In some embodiments, the circuit board 1 may include two opposite sides 13, and the electronic module may include two connectors 2 symmetrically arranged on the circuit board 1 and may be respectively connected to the two opposite sides 13. As shown in FIG. 5, the longitudinal pin connector 31 may be arranged on the portion of the top surface or the bottom surface of the circuit board between the two symmetrically-arranged connectors 2.

When the electronic module is about to be connected to another electronic module or electronic building block (either through longitudinal stacking or lateral connection), because the types of the pin connectors corresponding to the two modules are different, the connection between the two modules must be established only through a specific way, i.e., a correct way by adopting the male-female configuration. According to the design, it is not possible for two modules to be connected in a wrong way (e.g., incorrectly inverting a module in an undesired manner).

In some embodiments, a plurality of functional electronic components and/or chips may be arranged on the top surface 11 or the bottom surface 12 of the circuit board 1 to provide the electronic module with required functions. Any suitable electronic chip (or integrated circuit chip) may be pre-assembled into the circuit board 1 or may be integrated into the circuit board 1 through other means. Examples of the electronic chip may include but are not limited to: microcontrol unit (MCU, 8-bit, 16-bit and 32-bit), ARM CPU, MIPS CPU, USB2TTL, Ethernet, RS485, USB host, 2.4 GHz wireless, 433 MHz wireless, 866 MHz wireless, 950 MHz wireless, Wi-Fi, Bluetooth, Zigbee, near field communication (NFC), Micro SD, GPS, GPRS/GSM, 4G/LTE, wireless charger, MP3 decoder, amplifier, organic light-emitting diodes (OLED), motor driver, stepper driver, real time clock, accelerometer, gyroscope, magnetic field strength meter, lithium battery manager, dual link board, Arduino-to-Microduino pin convertor, skin current sensor, arsenic detector, resistor, capacitor, inductor, and/or other chips arranged in a same or a different module for making a desired modular electronic building system.

Figure 6:
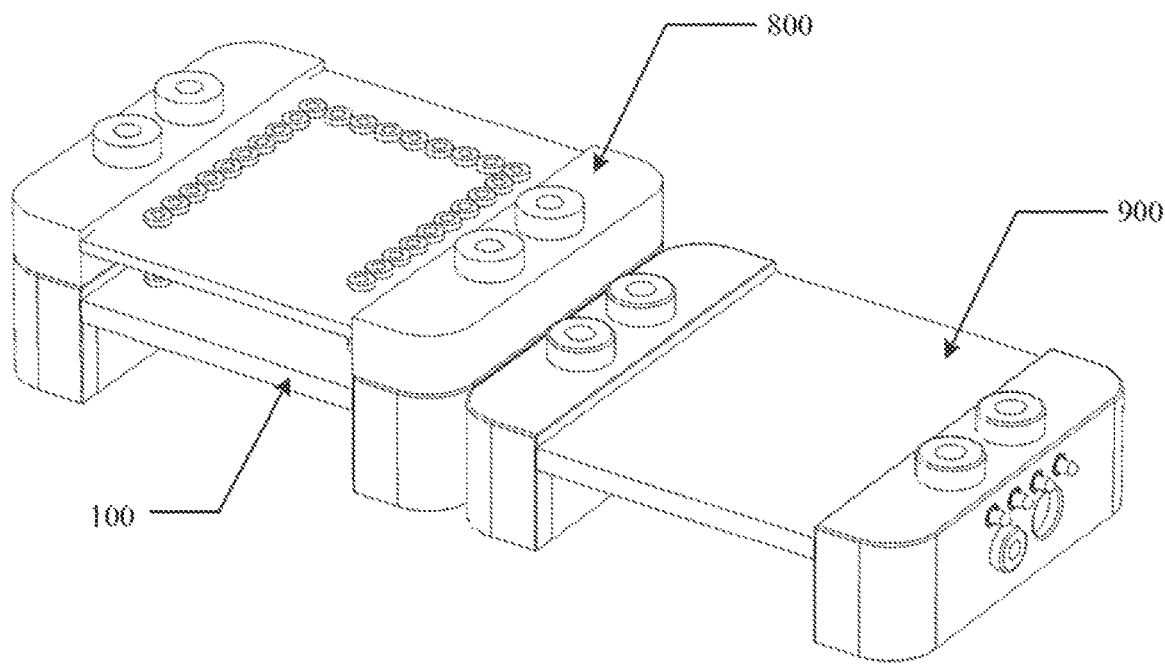
FIG. 6 illustrates a schematic diagram of an exemplary modular electronic building system consistent with some embodiments of the present disclosure.
Figure 7:
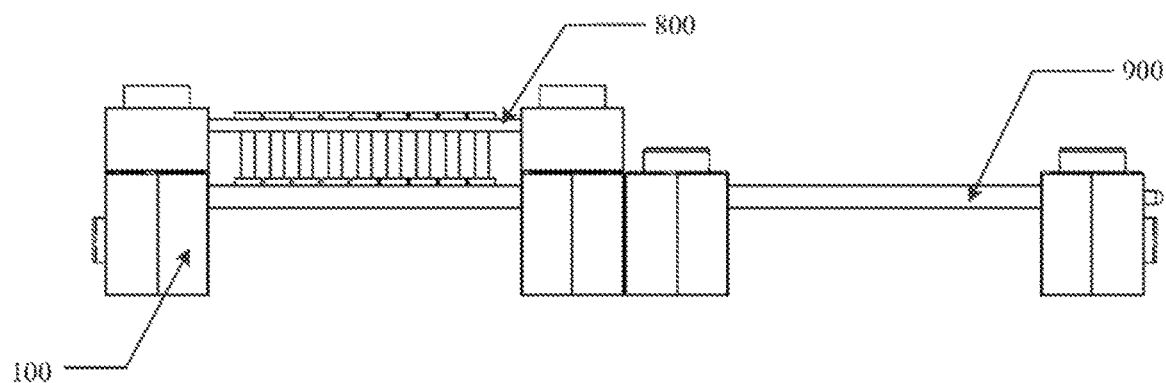
FIG. 7 illustrates a schematic front view of the modular electronic building system shown in FIG. 6.

FIG. 6 illustrates a schematic diagram of an exemplary modular electronic building system consistent with some embodiments of the present disclosure, and FIG. 7 illustrates a schematic front view of the modular electronic building system shown in FIG. 6. Referring to FIGS. 6-7, in one embodiment, a first electronic building block 800 may be vertically stacked on an electronic module 100 consistent with some embodiments of the present disclosure, and a second electronic building block 900 may be laterally connected to the electronic module 100. In the following, the first electronic building block 800 may be referred as to a vertically-stacked electronic building block 800 or a longitudinal electronic building block 800, and the second electronic building block 900 may be referred as to a laterally-connected electronic building block 900 or a lateral electronic building block 900.

The vertically-stacked electronic building block 800 and the laterally-connected electronic building block 900 may each be an electronic module consistent with the present disclosure, or may be any appropriate building block that can be connected to the electronic module according to the present disclosure. In FIGS. 6-7, only one vertically-stacked electronic building block and one laterally-connected electronic building block are provided as examples to illustrate the formation of a modular electronic building system. In other embodiments, the electronic module consistent with various embodiments of the present disclosure may be vertically stacked with and/or laterally connected to a plurality of electronic building blocks.

In some other embodiments, the circuit board 1 may include a MCU, and the longitudinal pin connector 31 and the lateral pin connector 32 may be electrically connected with corresponding pins of the MCU, respectively. The MCU may also be connected with other functional electronic components. The functional electronic components electrically connected to the MCU may include one or more of temperature sensors, humidity sensors, light sensors, air quality sensors, human body sensors, color recognition sensors, proximity sensors, collision sensors, posture sensors, heart rate sensors, gesture sensors, ultrasonic sensors, Hall sensors, voice collectors, image collectors, switches, displays, media players, light-emitting diode (LED) lights, buzzers, speakers, motors, etc.

Referring to FIGS. 6-7, when a plurality of functional electronic components are electrically connected to the MCU, the functional electronic components may be arranged on the circuit board of the electronic module 100, the vertically-stacked electronic building block 800, or the laterally-connected electronic building block 900.

In some embodiments, a PCB with a longitudinal pin connector 31 and/or a lateral pin connector 32 may be provided. An electronic chip may be placed (e.g., through soldering or welding) on the PCB to form an integrated circuit board 1. Further, the integrated circuit board 1 and one or more connectors 2 may be assembled together to form an electronic module that can be connected in multiple directions. That is, the integrated circuit board 1 together with one or more connectors 2 may form a multi-direction connectable electronic module.

The present disclosure also provides a modular electronic building system. The modular electronic building system may include at least one multi-direction connectable electronic module consistent with some embodiments of the present disclosure, and may also include a plurality of modules in other forms. The plurality of modules in other forms may include electronic modules or electronic building blocks that can be vertically stacked with the electronic module of the present disclosure, electronic modules or electronic building blocks that can be laterally and electronically connected to the electronic module of the present disclosure, toy building blocks that can be vertically stacked with the electronic module of the present disclosure, toy building blocks that can be laterally connected to the electronic module of the present disclosure, etc. Each module in the system may be able to perform one or more independent functions (e.g., processors, LEDs, buttons, light sensors, etc.), and the modules may be combined to form a larger circuit. Some modules may be able to respond to external events such as mechanical forces, touches, close ranges, radio-frequency (RF) signals, environmental conditions, etc. Some modules may be pre-programmed into various functional blocks such as synthesizers, oscillators, etc. Moreover, some other modules, e.g. electric source modules, may be simply used to provide an electric current. The modular electronic building system may also include, for example, an adapter board to match with other modular electronic building systems and the interfaces of the other modular electronic building systems.

FIGS. 6-7 illustrate schematic diagrams of an exemplary modular electronic building system consistent with some embodiments of the present disclosure. The schematic diagrams in FIGS. 6-7 show an exemplary case in which the electronic module shown in FIG. 5 is connected to other electronic building blocks in multiple directions. Referring to FIGS. 6-7, the multi-direction connectable electronic module 100 may be vertically stacked with a longitudinal electronic building block 800, and in the meantime, the multi-direction connectable electronic module 100 may also be laterally connected to a lateral electronic building block 900. The lateral electronic building block 900 may include a lateral inter-locking part interconnected with the lateral inter-locking part of the electronic module 100, a magnet with a magnetic polarity opposite to the surface magnetic polarity of the lateral magnetic connector of the electronic module 100, and a lateral pin connector interconnected with the lateral pin connector of the electronic module 100. The longitudinal electronic building block 800 may include a longitudinal inter-locking part interconnected with the longitudinal inter-locking part on each connector of the electronic module 100, a magnet with a surface magnetic polarity opposite to the surface magnetic polarity of the longitudinal magnetic connector of the electronic module 100, and a longitudinal pin connector interconnected with the longitudinal pin connector of the electronic module 100.

Referring to FIGS. 6-7, the longitudinal inter-locking parts 24 disposed on the two connectors 2 of the electronic module 100 may all be in contact with the bottom surface of the first electronic building block 800. That is, the plurality of protruding pillars of the top inter-locking structure 241 may be interconnected with the corresponding groove structures of the first electronic building block 800 to establish a physical connection. The flat-contact type longitudinal pin connector 31 of the electronic module 100 may be electrically connected to the pogo type pin connector of the first electronic building block 800 to establish an electrical connection. Each longitudinal magnetic connector 21 of the two connecting portions 2 of the electronic module 100 may be magnetically attracted by the magnets arranged on the shell of the first electronic building block 800 to establish a magnetic connection, which may reinforce the physical connection and the electrical connection between the electronic module 100 and the first electronic building block 800.

In the meantime, the lateral inter-locking part 25 of the electronic module 100 may be in contact with the side surface of the shell of the second electronic building block 900, that is, the protruding structure 251 and the recessed structure 252 may be interconnected with the corresponding physical structures of the second electronic building block 900 to realize a physical connection. The pogo type lateral pin connector 32 of the electronic module 100 may be electrically connected to the flat-contact type pin connector of the second electronic building block 900 to establish an electrical connection. The lateral magnetic connector 22 of the electronic module 100 may be attracted by the magnets on the shell of the second electronic building block 900 to establish a magnetic connection, which may reinforce the physical connection and the electrical connection between the electronic module 100 and the second electronic building block 900. It should be noted that the configurations of the first electronic building block and the second electronic building block do not have to be exactly the same as the electronic module 100; instead, only the physical structures, the pin types, and the magnetic polarities of the connectors of the first electronic building block and the second electronic building block may need to be configured according to the corresponding settings of the connectors 2 of the electronic module 100.

Figure 8A:
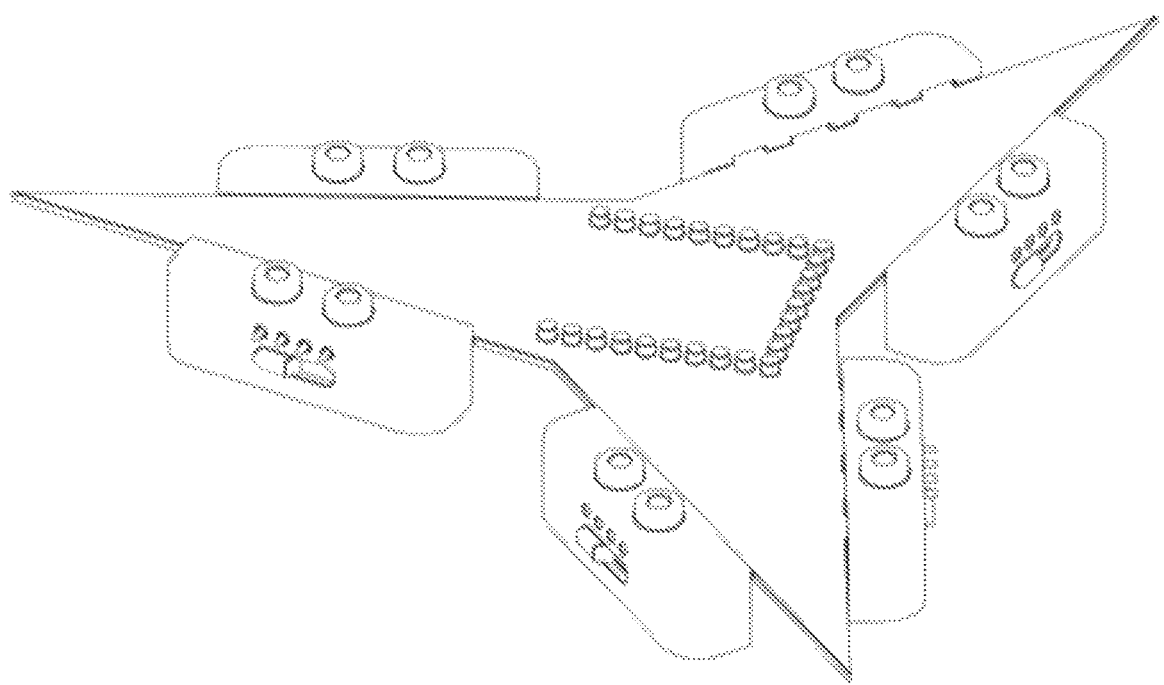
FIGS. 8A-8D illustrate schematic three-dimensional diagrams of various exemplary multi-direction connectable electronic modules consistent with some embodiments of the present disclosure.
Figure 8B:
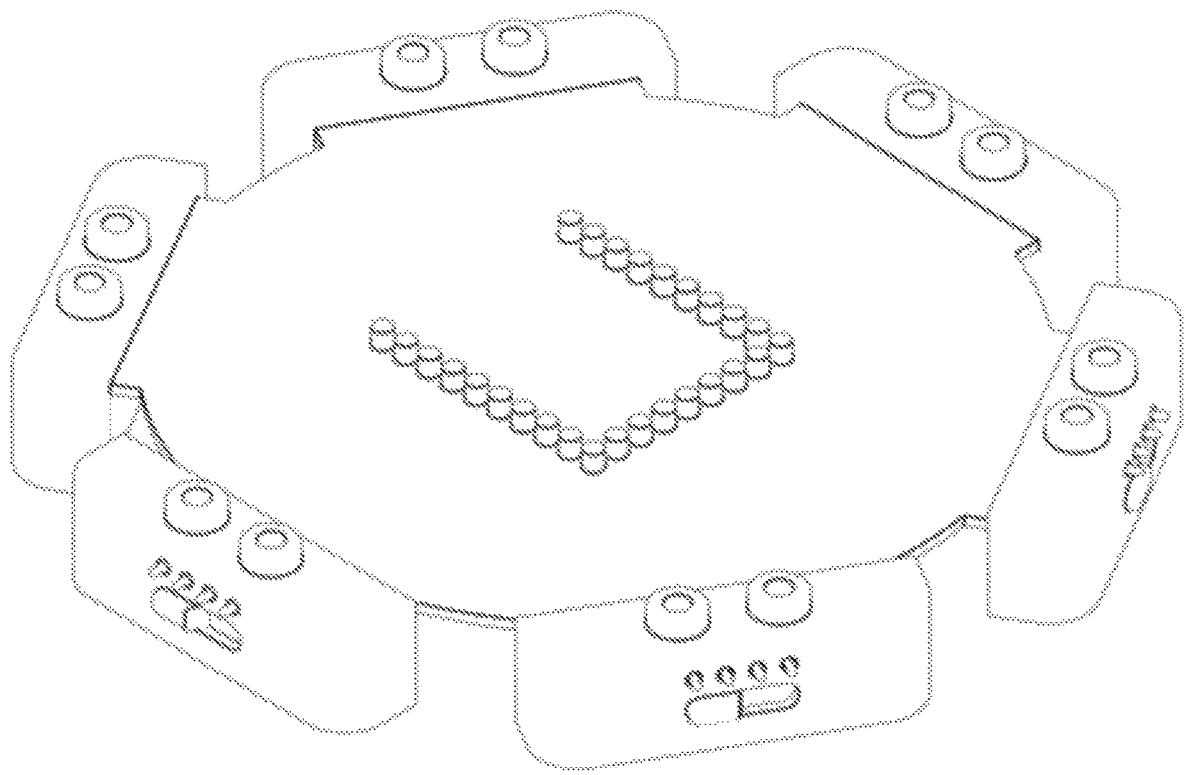
Figure 8C:
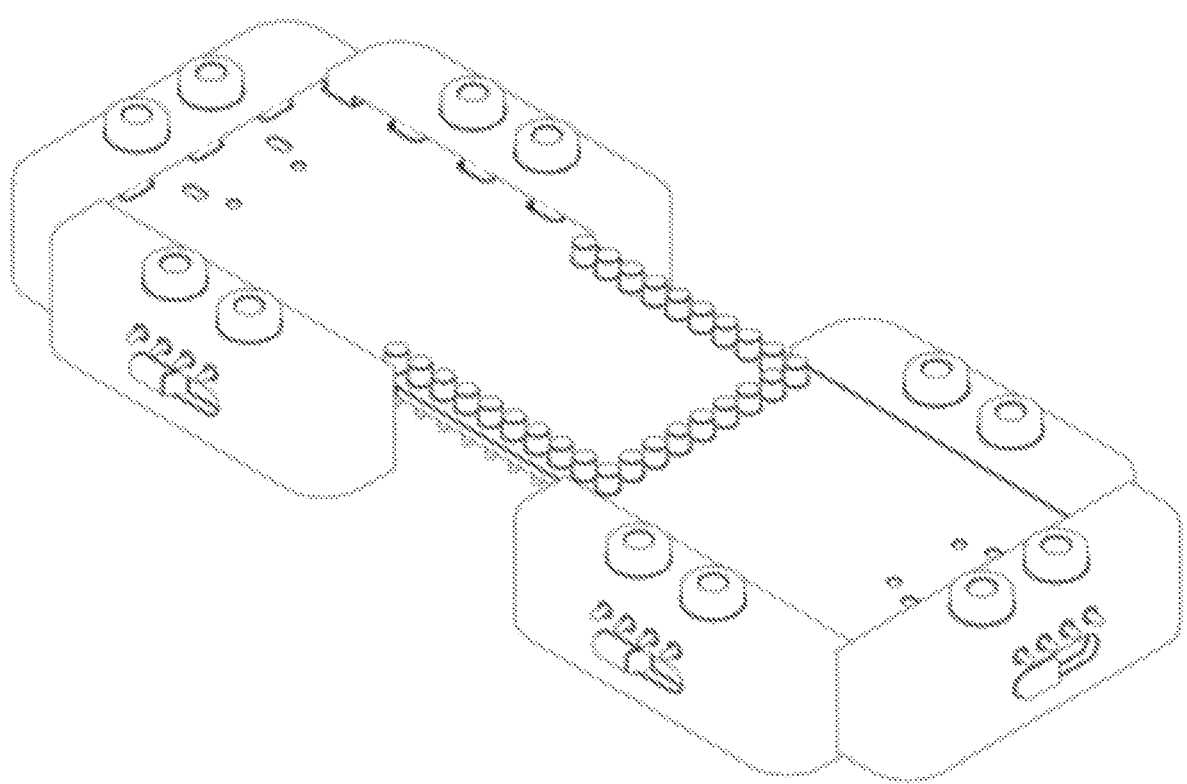
Figure 8D:
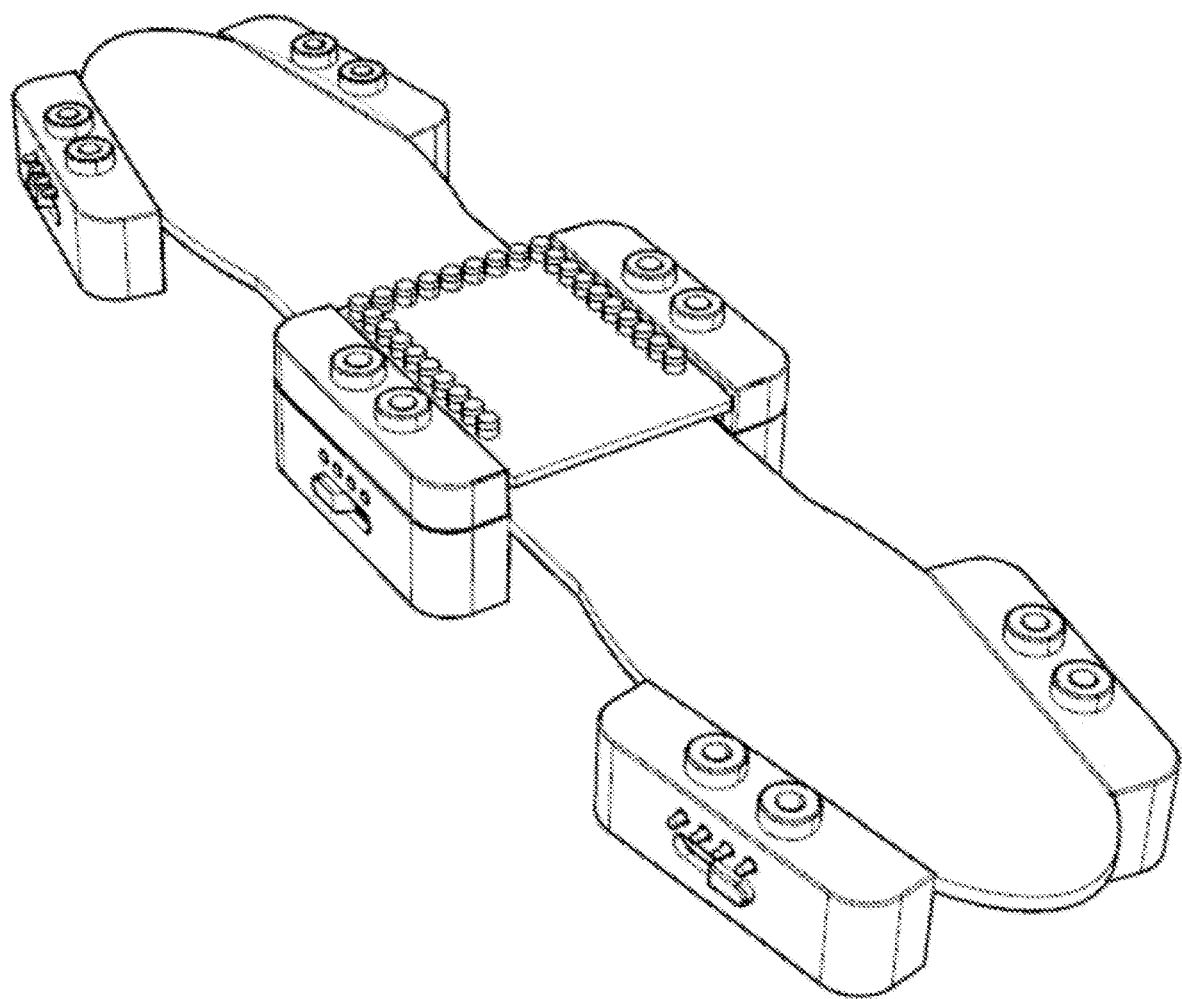

The electronic module provided by the present disclosure may also take many forms. FIGS. 8A-8D illustrate some exemplary multi-direction connectable electronic modules. Referring to FIGS. 8A-8D, the circuit board 1 of the electronic module may have any suitable shape, including not only rectangular shapes, but also various deformations and irregular shapes. Each side of the circuit board 1 can be connected to a corresponding connector 2. In some embodiments, the side length of the side 13 of the circuit board may be larger than the length of the side of the connector 2, and a plurality of connectors 2 may be connected to the side 13. In some embodiments, for example, as shown in FIG. 8D, when an electronic building block is stacked with the electronic module in the longitudinal direction, e.g., the electronic building block is stacked on the top surface of the electronic module, the top inter-locking structures 241 of the plurality of connectors 2 may be interconnected with corresponding bottom inter-locking structures of the electronic building block. For each connector 2 of the electronic module, it may be all or a part of the top inter-locking structure 241 (such as one of the two cylindrical pillars) interconnected with the electronic building block.

Figure 9:
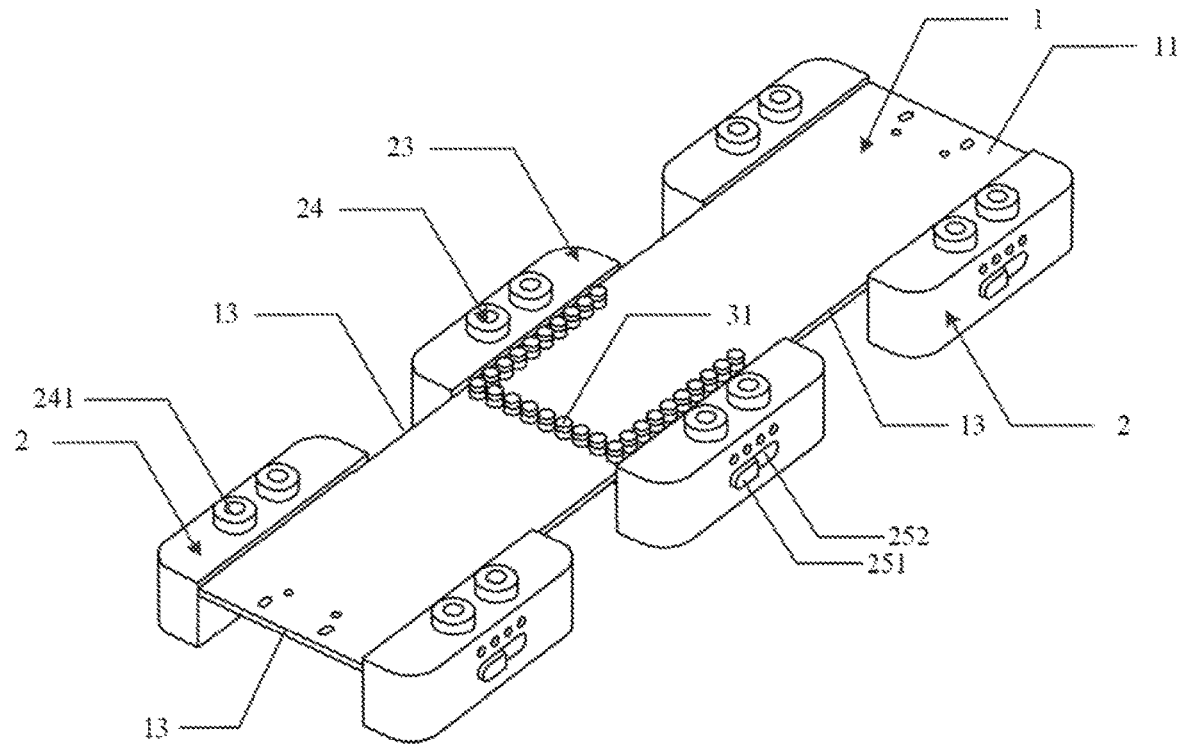
FIG. 9 illustrates a schematic three-dimensional diagram of another exemplary multi-direction connectable electronic module consistent with some embodiments of the present disclosure.
Figure 10:
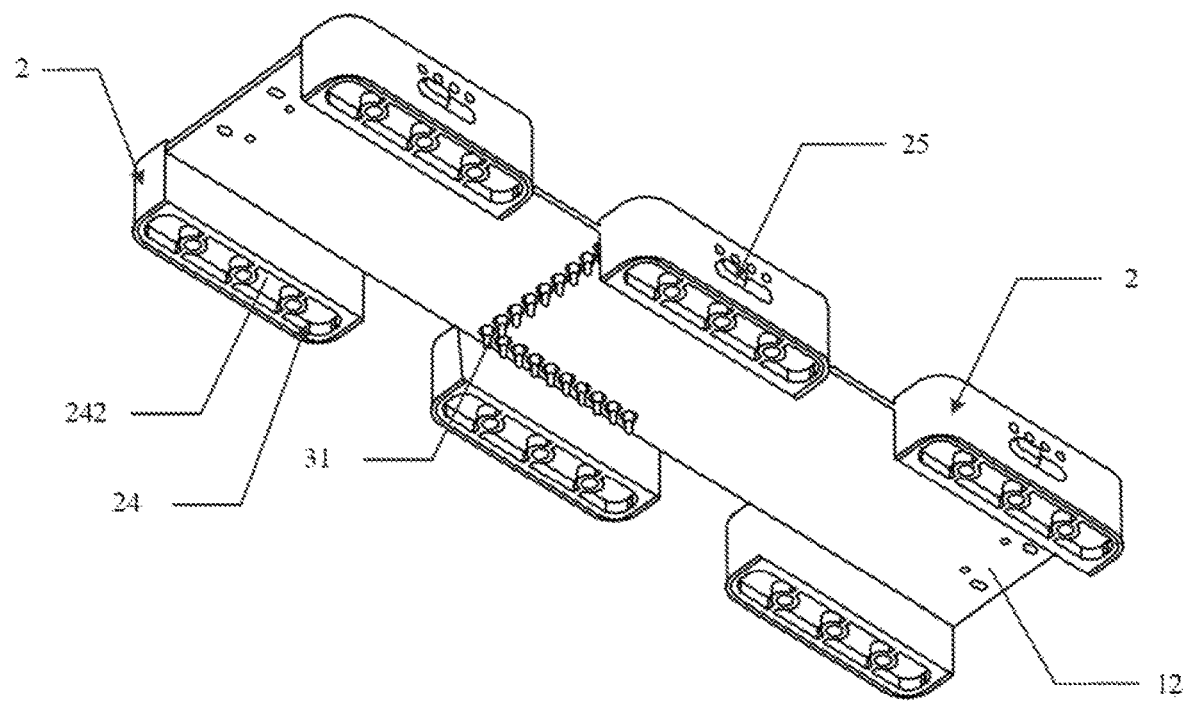
FIG. 10 illustrates another schematic three-dimensional diagram of the electronic module shown in FIG. 9.
Figure 11:
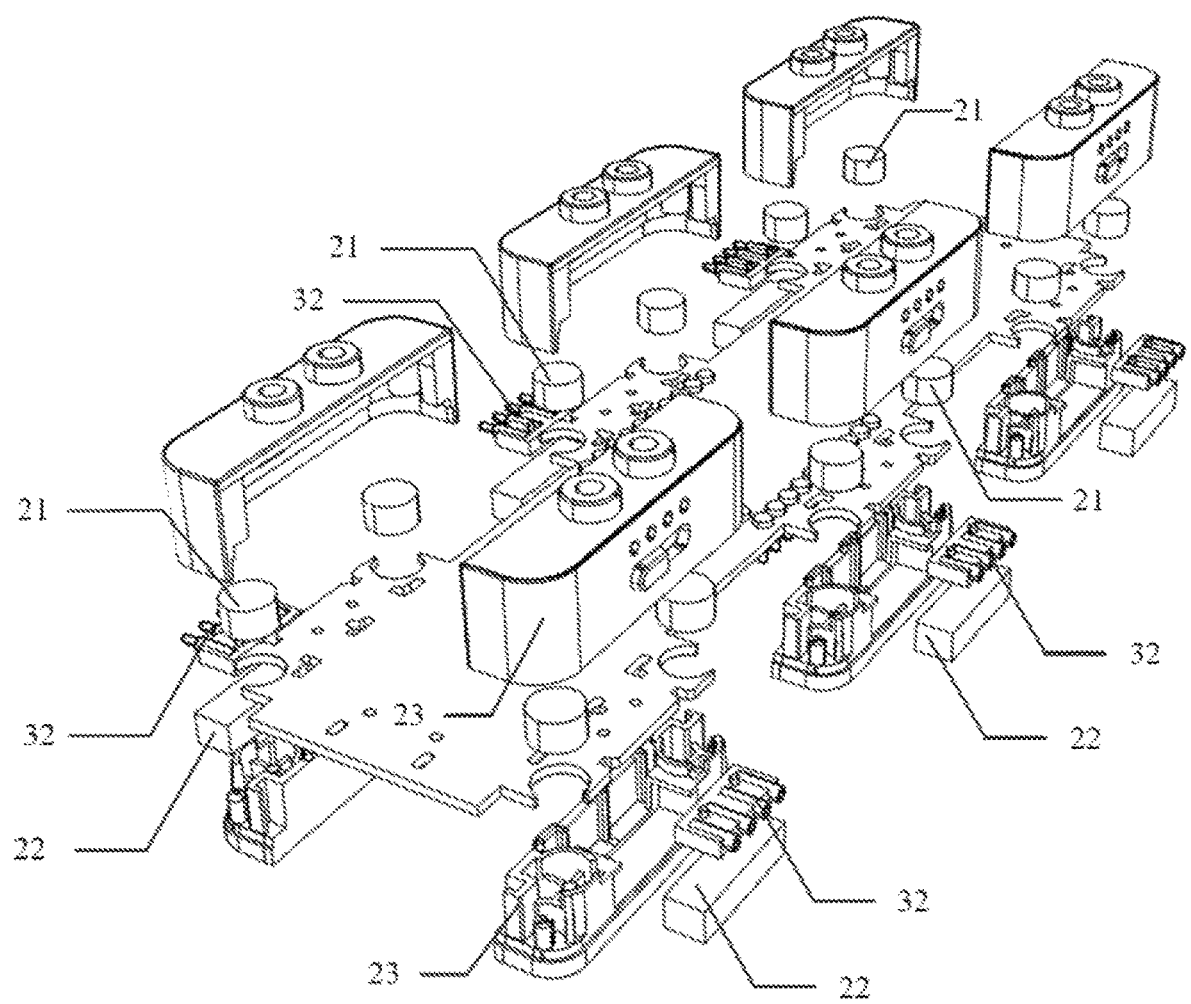
FIG. 11 illustrates a schematic three-dimensional decomposition diagram of the electronic module shown in FIG. 9.

FIGS. 9-11 illustrate schematic views of another multi-direction connectable electronic module consistent with some embodiments of the present disclosure. The electronic module may include three pairs of connectors 2, which are symmetrically disposed at opposite sides of the circuit board 1, respectively. In other embodiments, the connectors 2 may not necessarily be symmetrically arranged, or the sides of the circuit board 1 may not necessarily contact the connectors 2. The longitudinal pin connector 31 of the electronic module may be located at a portion of the circuit board 1 corresponding to the centered pair of connectors 2. In other embodiments, the electronic module may include multiple longitudinal pin connectors 31, or the longitudinal pin connector 31 may be disposed in a non-centered position of the circuit board 1. Alternatively, the position of the longitudinal pin connector 31 at the top surface 11 of the circuit board 1 may be different from the position of the longitudinal pin connector 31 at the bottom surface 12 of the circuit board 1. For example, a longitudinal pin connector 31 is located at the center of the top surface, and another longitudinal pin connector 31 is closed to the edge of the bottom surface. In one embodiment, the plurality of connectors 2 may all have a same physical structure. In other embodiments, the plurality of connectors 2 connected to the same circuit board 1 may have different physical structures to accommodate different types of electronic building blocks to be vertically stacked with or laterally connected to.

FIGS. 9-12 illustrate schematic views of an exemplary multi-direction connectable electronic module consistent with some embodiments of the present disclosure. The structural configuration of the lateral inter-locking part of the electronic module shown in FIGS. 9-12 may be different from the structural configuration of the lateral inter-locking part 25 of the electronic module shown in FIGS. 1-5. For example, the protruding structure 251 and the recessed structure 252 of the electronic module shown in FIGS. 9-12 may be arranged next to each other and may together form a rectangle with rounded corners. However, the protruding structure 251 and the recessed structure 252 of the electronic module shown in FIGS. 1-5 may be separated from each other. The protruding structure 251 and the recessed structure 252 may include a plurality of cylindrical pillars and a plurality of holes, respectively. In other embodiments, the lateral inter-locking part 25 may have any other appropriate shapes.

The lateral magnetic connector of the electronic module shown in FIGS. 9-12 and the lateral magnetic connector 22 of the electronic module shown in FIGS. 1-5 may be configured differently. For example, the lateral magnetic connector of the electronic module shown in FIGS. 9-12 may be a single cuboid magnet and the lateral magnetic connector of the electronic module shown in FIGS. 1-5 may be two separate cylindrical magnets. In other embodiments, the lateral magnetic connection 22 may have any appropriate shape.

Figure 12:
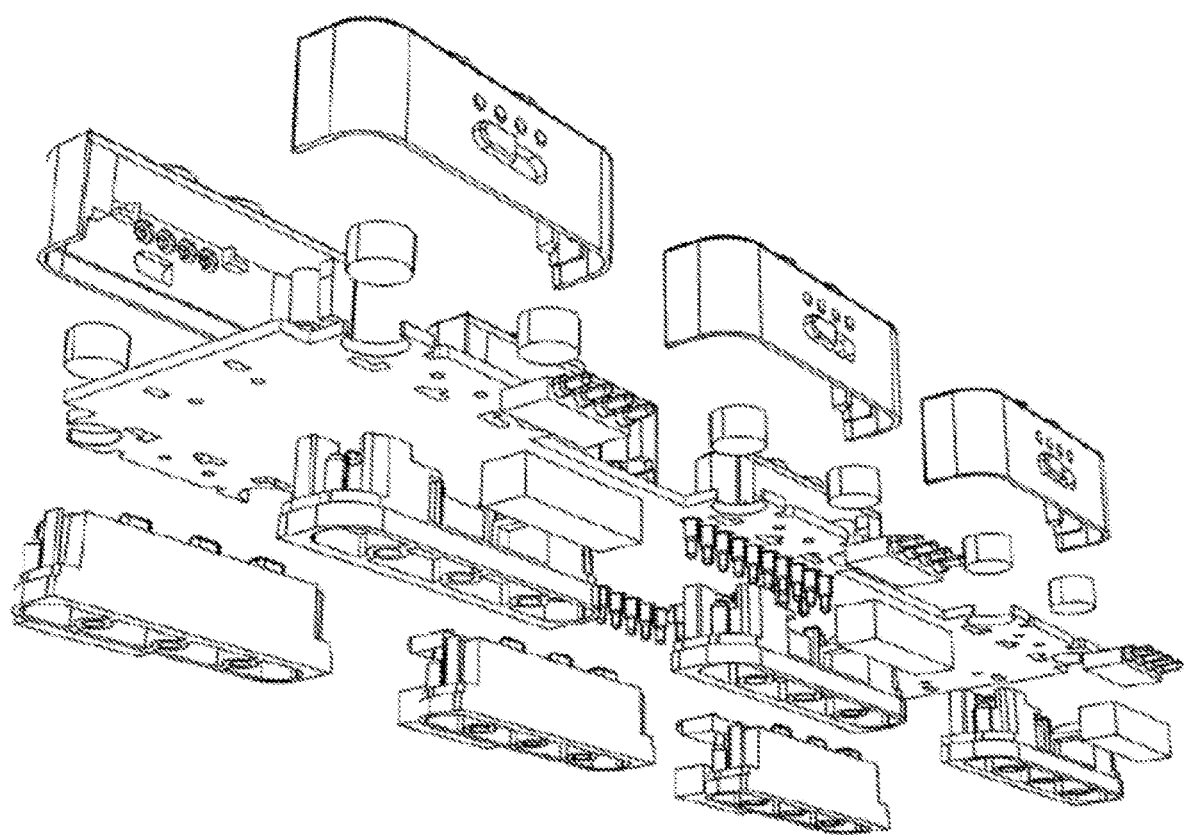
FIG. 12 illustrates another schematic three-dimensional decomposition diagram of the electronic module shown in FIG. 9.

As shown in FIGS. 11-12, the side 13 of the circuit board may have a shape feature matching with the longitudinal magnetic connector 21. For example, when the longitudinal magnetic connector 21 is a cylindrical magnet, a recessed arc feature may be formed at the corresponding position of the side 13 of the circuit board. Moreover, the shell 23 may also include a circular hosting slot matching with each longitudinal magnetic connector 21. As shown in FIGS. 11-12, a plurality of hosting slots are arranged at both ends of the housing 23 corresponding to the plurality of cylindrical magnets of the longitudinal magnetic connector 21. The diameter of the circular hosting slot and the recessed arc feature may be equal to or slightly larger than the diameter of the cylindrical magnet. In some embodiments, the longitudinal magnetic connectors 21 of the plurality of connectors 2 of the electronic module may have the same surface polarity configuration, for example, the top surfaces may all be the N poles. In some embodiments, the lateral magnetic connectors 22 of the plurality of connectors 2 of the electronic module may have the same surface polarity configuration. For example, the N poles of the lateral magnetic connectors 22 located on the left side of the circuit board 1 may all be at the outer side surface, and the S poles of the lateral magnetic connectors 22 located on the right side of the circuit board 1 may all be at the outer side surface. In some embodiments, the lateral pin connectors 32 corresponding to the plurality of connectors 2 of the electronic module may be the same contact type. For example, the lateral pin connectors 32 on the left side of the circuit board 1 may all be the pogo type and the lateral pin connector 32 on the right side of the circuit board 1 may all be the flat-contact type.

Figure 13:
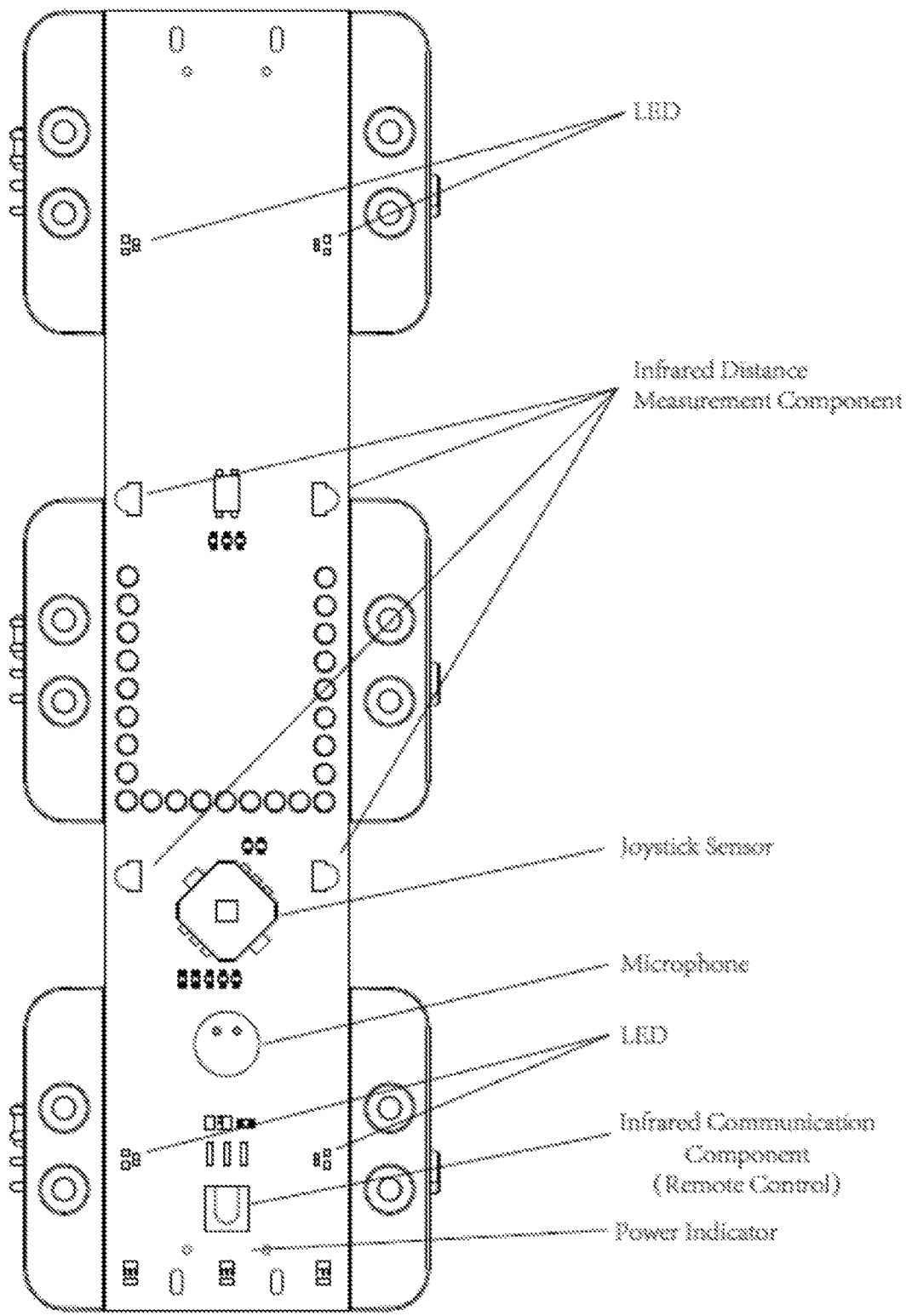
FIG. 13 illustrates a schematic top view of the electronic module shown in FIG. 9 with a plurality of electronic components disposed on the electronic module.
Figure 14:
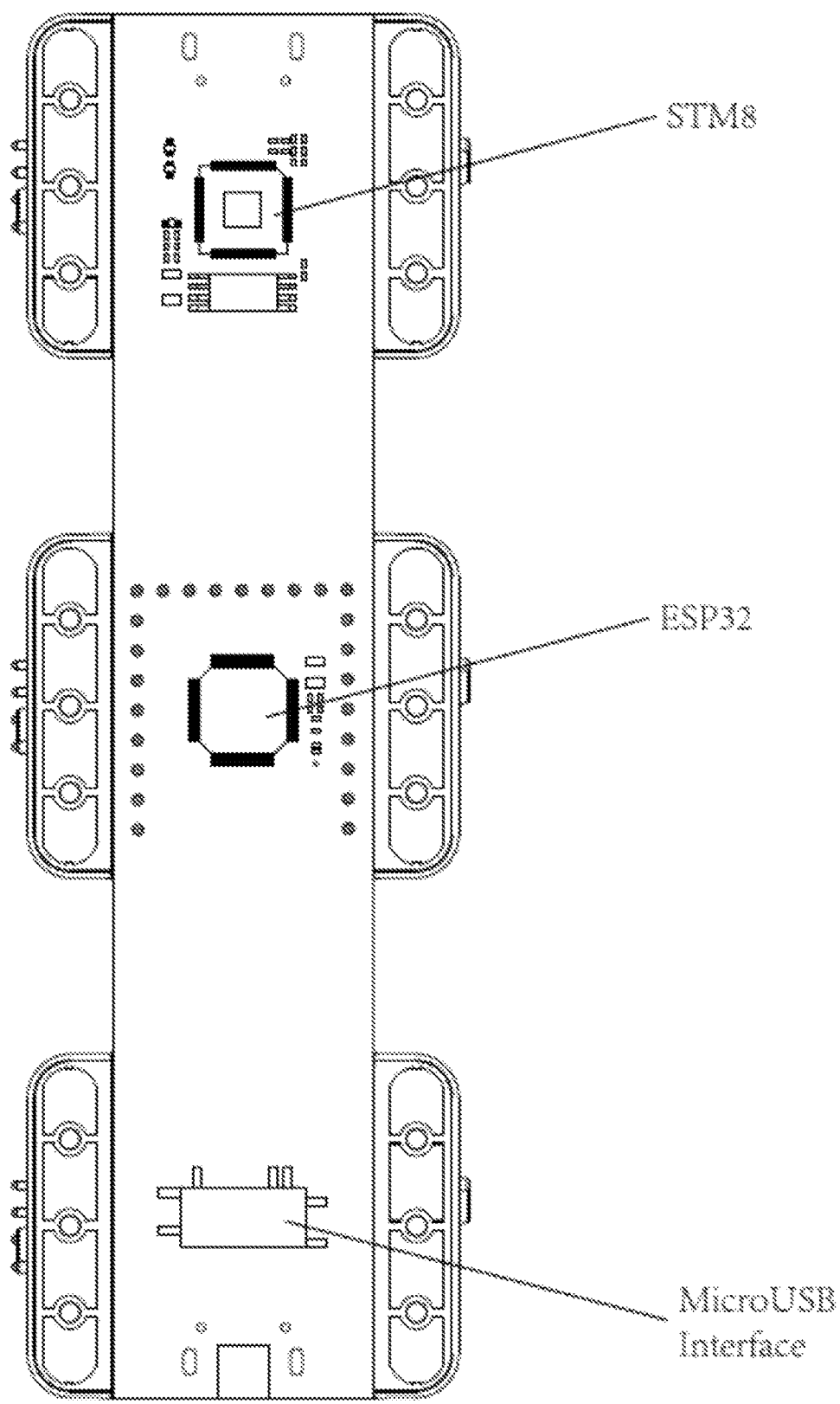
FIG. 14 illustrates a schematic bottom view of the electronic module shown in FIG. 9 with a plurality of electronic components disposed on the electronic module.
Figure 15A:
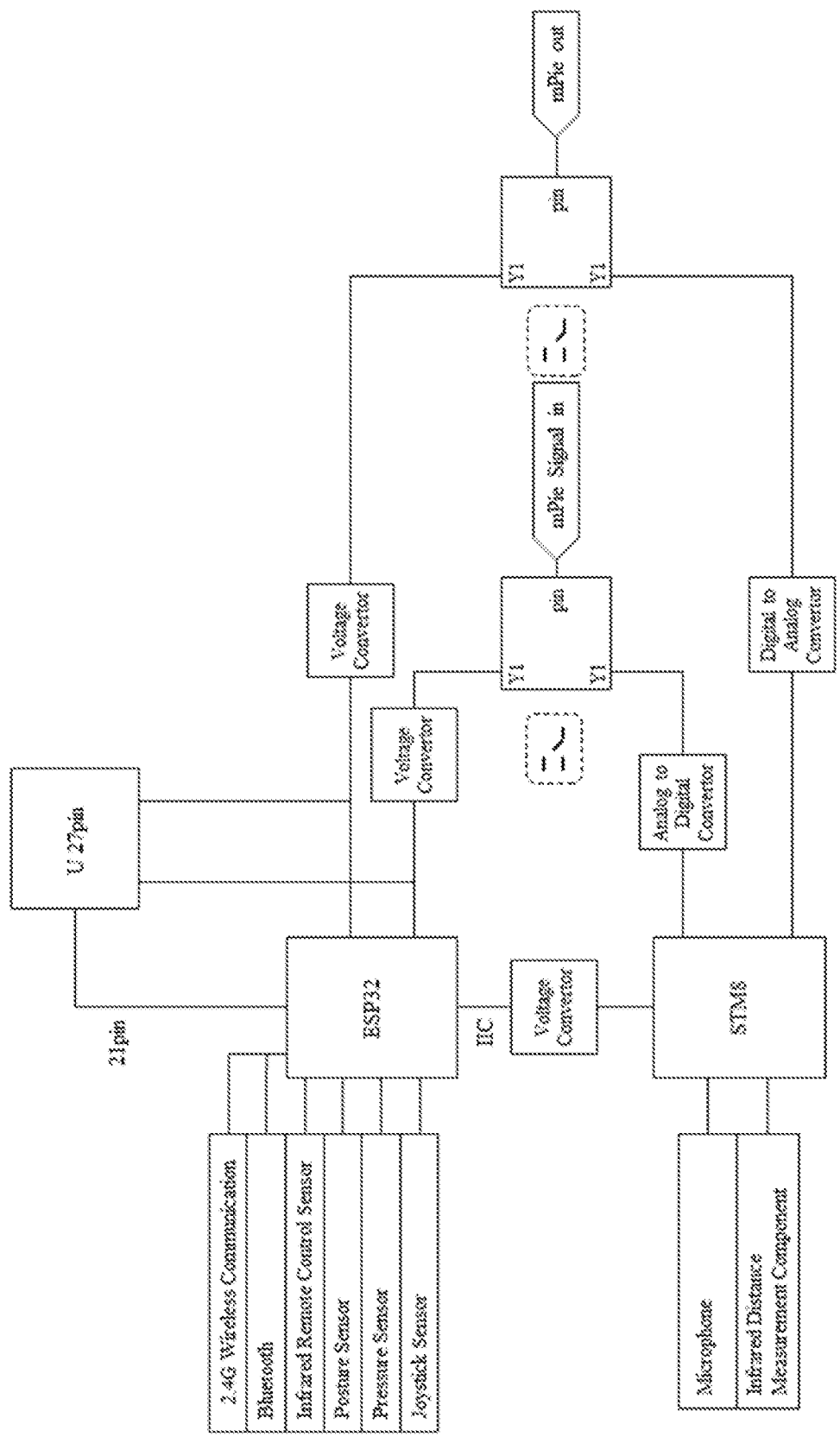
FIGS. 15A-15C illustrate schematic circuit diagrams of the electronic module shown in FIG. 13 and FIG. 14.
Figure 15B:
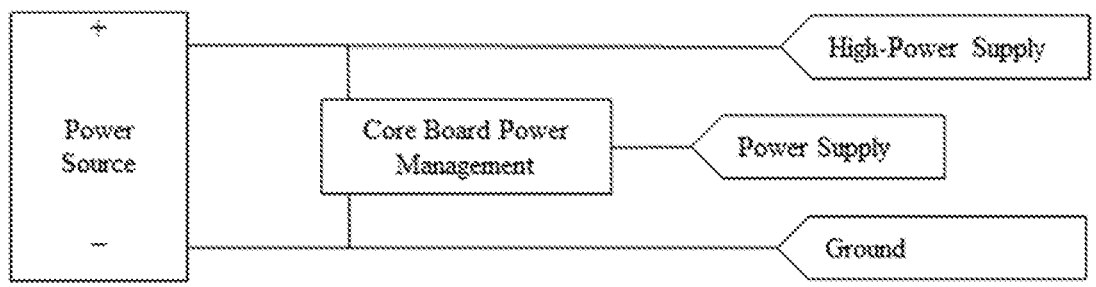
Figure 15C:
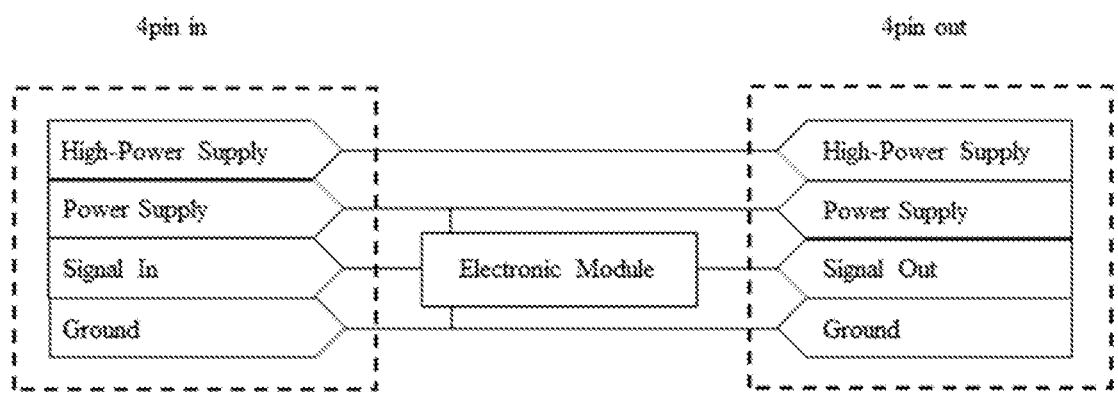

The circuit board 1 may include a plurality of electronic components and/or electronic chips. The electronic components and/or electronic chips arranged on the circuit board may not be limited to any specific type, and the number of the electronic components and/or electronic chips arranged on the circuit board may not be limited to any specific value. FIG. 13 illustrates a schematic top view of the electronic module shown in FIG. 9 with a plurality of electronic components disposed on the electronic module. FIG. 14 illustrates a schematic bottom view of the electronic module shown in FIG. 9 with a plurality of electronic components disposed on the electronic module. FIG. 15A illustrates a schematic circuit diagram of the electronic module shown in FIGS. 13-14, FIG. 15B illustrates a schematic diagram of the power connection in the electronic module shown in FIGS. 13-14, and FIG. 15C illustrates a schematic view of the interface of the electronic module shown in FIG. 1 or FIG. 5.

The types and the layouts of the electronic components shown in FIGS. 13, 14 and 15A-15C are all exemplary. In practical applications, the electronic components disposed on the circuit board 1 of a multi-direction connectable electronic module consistent with various embodiments of the present disclosure may have any appropriate number and type.

As shown in FIG. 14, a microprocessor electronic chip may be arranged on the bottom surface 12 of the circuit board 1. The circuit board 1 may include one or more microprocessor units/microcontroller units (MCUs), and the models and the configurations of the one or more microprocessor units/MCUs may be selected according to the actual application. In some embodiments, the MCUs may further have a wireless communication control function for transmitting control signals and feedback signals to wirelessly-connected smart terminals. In one embodiment, referring to FIG. 14, the electronic module may include two MCUs, for example, an STM8 and an ESP32. The two MCUs may be used to control other electronic components disposed on the circuit board 1 as well as the electronic components disposed on the electronic building blocks stacked vertically and/or connected laterally with the electronic module to implement various functions. In other words, the electronic module shown in FIG. 14 may be used as a core module to, through programming the MCUs, control a plurality of electronic building blocks that are directly or indirectly connected with the electronic module, and thus implement a plurality of functional extensions.

Referring to FIGS. 13-14, a plurality of commonly-used sensors may be integrated onto the circuit board 1 of the electronic module. When a user programs the MCUs, the sensors integrated on the circuit board may be directly called by the MCUs to achieve various functions. For example, the top surface 11 and the bottom surface 12 of the electronic module may respectively have two infrared emitting sensors and two infrared receiving sensors. The combination of the two infrared emitting sensors and the two infrared receiving sensors may allow to measure the distances along six directions of the three orthogonal axes, i.e., the front distance, the rear distance, the left distance, the right distance, the top distance, and the bottom distance. The arrangement of the two infrared emitting sensors and the two infrared receiving sensors together with the distance measurement capability may be used for developing various functions, e.g., an automatic obstacle-avoidance function for drones (i.e, unmanned aerial vehicles) or small cars. In addition, a plurality of LED lights may be arranged at the four corners of the top surface 11 of the electronic module, and the plurality of LED lights may be used as flashing lights or may be used to indicate the operation status of the four shafts or the four propellers, or an obstacle distance in each direction. Some other electronic components integrated on the circuit board 1 may include but are not limited to: a posture sensor, which may detect the orientation, the rotation angle, and the acceleration rate of the core module and may control, for example, the motion of a robot arm of a drone; a Bluetooth/ 2.4G communication module, through which the electronic module may be directly controlled by a mobile-phone APP or a remote control; a digital infrared signal receiver, through which simple operations may be controlled using an infrared remote control; a pressure sensor, which may measure changes in the height; and/or a color LED, which may send out different colors for different meanings. In addition, the electronic components integrated on the circuit board 1 may also include a light intensity sensor, a sound intensity sensor, a buzzer, etc. Optionally, a power amplifier circuit that allows a large output current may also be arranged on the circuit board 1. Moreover, the circuit board 1 may also be equipped with a Micro-USB port for wired data transmission with the MCUs.

Other electronic building blocks may be connected with the multi-direction connectable electronic module through a specific interface (an interface forming a male-female configuration with the longitudinal pin connector 31 and/or the lateral pin connector 32). The interface may be able to transmit analog signals. In addition, the interface may also be able to transmit digital signals with communication protocols. As shown in FIGS. 13-14, two longitudinal pin connectors 31 may be arranged on the top surface 11 and the bottom surface 12 of the circuit board 1, respectively. Each longitudinal pin connector 31 may have a U-shaped 27-pogo-pin interface, and the pogo pins of each longitudinal pin connector 31 may include a digital signal input terminal, a digital signal output terminal, an analog signal input terminal, an analog signal output terminal, a power supply terminal, and a ground. When the electronic module shown in FIGS. 13-14 is electrically connected to a plurality of vertically-stacked electronic building blocks via the longitudinal pin connector 31, and the plurality of electronic building blocks may powered up by the electronic module and data communication may be enabled. The vertically-stacked electronic building blocks may include more types of sensors, such as vibration sensors, magnetic field strength sensors, temperature and humidity sensors, light sensors, etc. The vertically-stacked electronic building blocks may also include other electronic components, such as lamps, timers, potentiometers, square waves, inverter motors, steering gear, etc.

As shown in FIG. 15B, the electronic module may include a power management unit, connected to a power source (such as a battery or an external power source connected through the Micro-USB port), for providing the required source voltage to all the electronic components of the electronic module that require electric power.

The left side and the right side of the electronic module shown in FIGS. 13-14 may be respectively connected with three lateral pin connectors 32, and each lateral pin connector 32 may be a four-pin connector. The four contacts of each lateral pin connector 32 may include a power supply terminal, a ground terminal, a digital-to-analog (D/A) and/or analogue-to-digital (A/D) converter terminal, and a high-power connection terminal. In one embodiment, the contacts of the three left-side lateral pin connectors 32 may be the pogo type, and may provide A/D conversion, digital signal input and output, electric power, etc. for the electronic building blocks connected from the left side of the electronic module. For example, when the electronic module is electrically connected to a laterally-connected electronic building block via the lateral pin connectors 32 on the left side, the electronic module may be able to read analog voltage values (usually between 0 V and 5 V) and convert the analog voltage values into digital signals for the MCU to read out, or may be able to input or output digital signals (low and high) to the laterally-connected electronic building block. Optionally, the three lateral pin connectors 32 may also provide connection to a high-power terminal (for example, by directly connected to a battery or a power amplifier circuit) for outputting a large current. The contacts of the three right-side lateral pin connectors 32 may be the flat-contact type, and may provide D/A conversion (output analog voltage values), digital signal input and output, and power supply functions for the electronic building blocks connected from the right side of the electronic module. In some embodiments, the lateral pin connector 32 may only have three contacts, namely a power supply terminal, a ground terminal, and a D/A or A/D converter terminal. For example, the electronic building blocks connected laterally to the electronic module may be able to communicate with the electronic module through digital signals and/or analog signals. The digital signals may be sent in and out along the 6 side directions of the electronic module, and the analog signals may only be input to the core module from the left-side 3 ADC interfaces of the core module and may only be output from the right-side 3 DAC interfaces. Modules for receiving digital signals may include triggers, timers, square waves, inverter motors, AND gates, OR gates, button switches, etc.; modules for inputting analog signals may include photo sensors, infrared triggers, potentiometers, electric switches, etc.; and modules for outputting analog signals may include lights, light bars, digital tubes, buzzers, motors, steering gears, etc.

In some embodiments, the circuit board 1 may include two MCUs, i.e. a first MCU and a second MCU, and the two MCUs may have different operating voltages.

Accordingly, the circuit board 1 may also include a first voltage converter arranged at a position that connects the first MCU to the second MCU. Two-way communication may be established between the first MCU and the second MCU through the first voltage converter. The first MCU may be a master control unit, and functional electronic components connected with the second MCU may input signals from or output signals to the first MCU through the second MCU.

Further, in one embodiment, the circuit board 1 may also include an analog switch. The analog switch may be electrically connected to the second MCU, and may be controlled by digital signals sent from the second MCU to switch the electronic module between multiple operation modes.

In some embodiments, the circuit board 1 may further include an A/D converter and a D/A converter that are electrically connected to the second MCU. The electronic building blocks that are connected laterally with the electronic module may include an input-type electronic building block and an output-type electronic building block. The lateral pin connector 32 that is electrically connected to the input-type electronic building block may include a contact connected to the A/D converter for receiving input signals of the input-type electronic building block. The lateral pin connector 32 that is connected to the output-type electronic building block may include a contact connected to the D/A converter for sending output signals to the output-type electronic building block.

In some embodiments, the circuit board 1 may further include a second voltage converter electrically connected to the first MCU. The lateral pin connector 32 may include one contact connected to the second voltage converter for receiving input digital signals from or sending output digital signals to the electronic building blocks that are laterally connected to the electronic module.

In some embodiments, the longitudinal pin connector 31 may be electrically connected to the first MCU for receiving input digital signals from or sending output digital signals to the electronic building blocks that are vertically stacked with the electronic module.

As shown in FIG. 15A, the circuit board 1 may include two MCUs, i.e., an ESP32 and an STM8, to implement all the functions. In one embodiment, the ESP32 may be used as a master MCU, the STM8 may be used as a secondary MCU, and the ESP32 and the STM8 may establish two-way communication through an IIC interface. Because the operating voltage of the master MCU is 3.3V and the operating voltage of the secondary MCU is 5V, a voltage converter may be disposed in each path that connects the master MCU and the secondary MCU. The ESP32, serving as the master MCU, may have its own Bluetooth and 2.4G network wireless communication control functions. Some sensors integrated on the circuit board (such as an infrared remote control sensor, a joystick sensor, etc.) may be connected to digital IO ports of the ESP32. Some sensors integrated on the circuit board (such as the attitude and pressure sensor) may be connected to the IIC of the ESP32. Moreover, some other sensors may be connected to the IO ports of the STM8 (such as microphones, and four pairs of infrared emitters and receivers which, through infrared remote sensing, are used for detecting obstacles in all directions), and indirectly transmit signals to the master MCU through the IIC.

The 4 pin contacts (also referred to as side ports) of each lateral pin connector on the side may be defined as terminals for power supply, ground, data signals, and power output, respectively. The power supply terminal and the ground terminal may be 5V and 0V, respectively, and may provide electric power to the electronic building blocks connected laterally with the electronic module (core module) either from the left side or from the right side. However, the power supply terminal and the ground terminal may not be able to provide an excessively large current. The power output terminal may be directly connected to the cathode of a power supply (such as an external battery) such that a large current can be sent out. The data signal terminal may be directly connected to an analog switch (similar to a single-pole double-throw switch) that is controlled by the digital signals sent from the STM8. In other words, each group of the lateral interfaces may provide two working modes, and switching between the two working modes for each group of the lateral interfaces may be separately controlled through programming. For example, the first terminal of the switch may be connected to the data signal terminal of the lateral pin connector 32, and in mode one, the second terminal of the switch may be connected to a D/A converter or an A/D converter; in mode two, the second terminal of the switch may be connected to a voltage converter (and then, may be connected to the ESP32).

Mode 1 is an analog input/output (TO) mode. When the STM8 controls the switch to switch to mode one, the data signal terminal of the lateral pin connector 32 may be connected to a D/A converter or an A/D converter, and then connected to the STM8. That is, the data signal terminal of the lateral pin connector 32 may be connected to the STM8 through a D/A converter or an A/D converter. In some embodiments, the data signal terminals of the three lateral pin connectors 32 on the left side of the circuit board may be connected to an A/D converter for receiving input analog signals. The data signal terminals of the three lateral pin connectors 32 on the right side of the circuit board may be connected to a D/A converter for sending output analog signals. The laterally-connected electronic building block 900 may be a building block system that connects to the right side of the electronic module and transmits analog signals in the range of 0 to 5 V. Therefore, the electronic module may be connected to the leftmost, the middle, or the rightmost side of the building block system, and may read the input signals from the electronic building block on the left side and may output signals to the electronic building block on the right side. In this mode (i.e. mode one), the 27 pogo pins on the top surface of the circuit board 1 may not be occupied. That is, the 27 pogo pins on the top surface of the circuit board 1 may not be specifically used to connect any terminal in order to realize mode one. Therefore, all modules and functions connected in the vertical direction at the same time may not be affected.

Mode two is a digital IO mode. When the STM8 controls the switch to switch to mode two, the data signal terminal of the lateral pin connector 32 may be directly connected to a digital IO port of the master MCU (after voltage conversion). In this scenario, among the 4 pins, the one connected to the digital IO port may be equivalent to an extension of the IO port of the master MCU, and thus may be used to laterally connect a module that requires to be controlled by digital signals. In this mode, a variety of motor modules can be connected to the electronic module so that various applications, such as drones, balance cars, etc., may be assembled. In some embodiments, in this mode, the 6 IO ports of the ESP32 on the side may also be connected to some contacts of the longitudinal pin connector, and the electronic building blocks stacked vertically may not be able to have full functional performance (for example, in mode two, the number and/or the types of external modules and sensors that the electronic module can be connected to may be less than the number and/or the types in mode one). In some embodiments, when the working voltage of the laterally-connected electronic building blocks is the same as that of the master MCU, the system may not need to include a voltage converter.

Figure 16A:
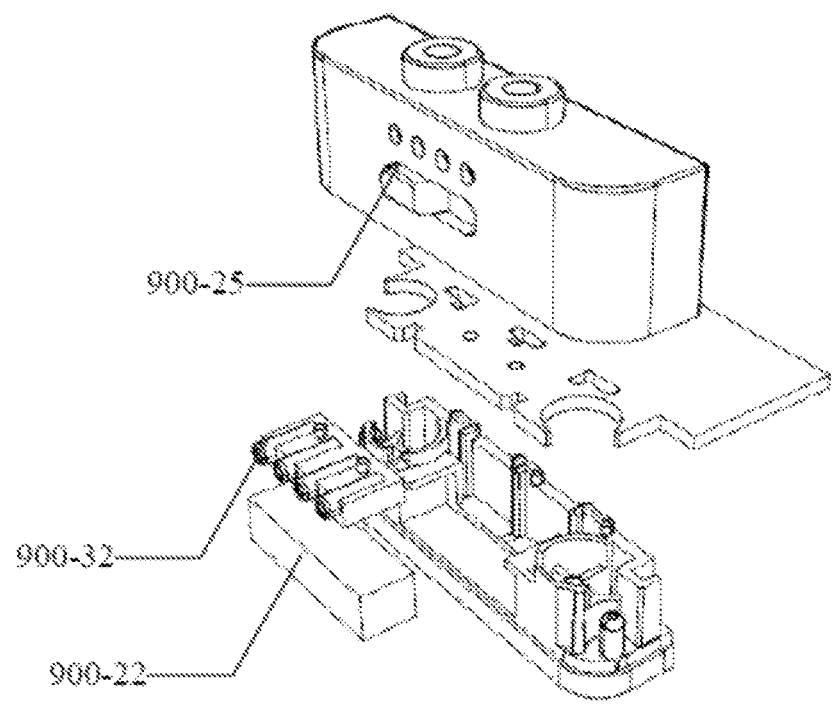
FIGS. 16A-16B illustrate schematic three-dimensional decomposition diagrams of a connector of an electronic building block that can be laterally connected with the electronic module shown in FIG. 9.
Figure 16B:
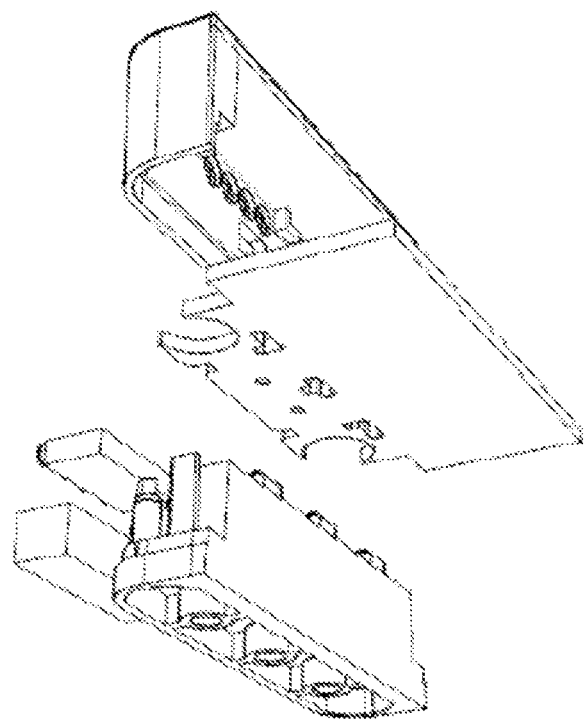

FIGS. 16A-16B illustrate schematic three-dimensional decomposition diagrams of a connector of an electronic building block that can be laterally connected with the electronic module shown in FIG. 9. Referring to FIGS. 16A-16B, the connector of the laterally-connected electronic building block 900 may have the same structure as the connector 2 according to some embodiments of the present disclosure. That is, the laterally-connected electronic building block 900 may include: a positioning structure 900-25 interconnected with the lateral inter-locking part 25, a magnet 900-22 with a magnetic polarity opposite to the surface magnetic polarity of the lateral magnetic connector 22, and a pin connector 900-32 interconnected with the lateral pin connector 32 to establish electrical connection.

Figure 17A:
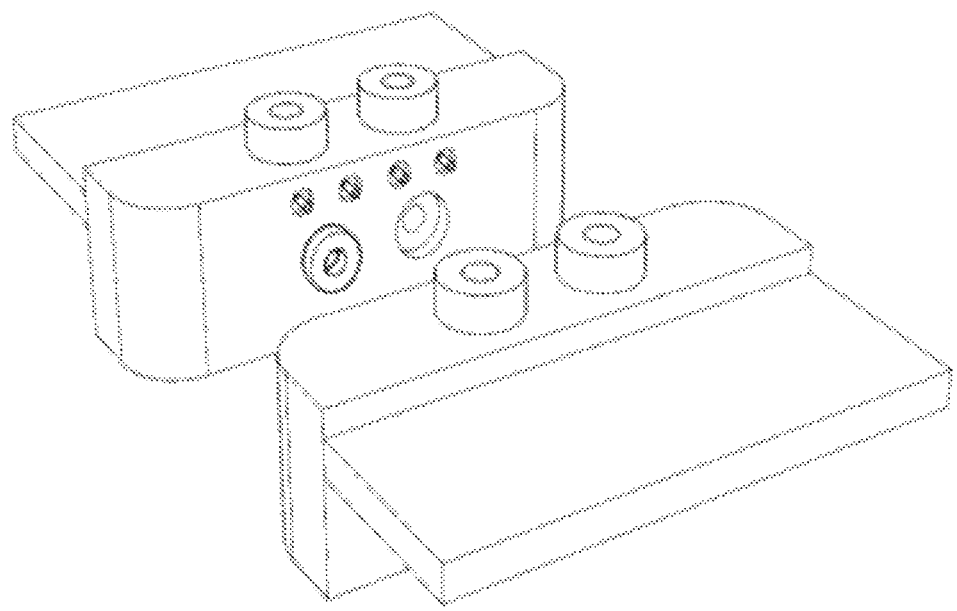
FIGS. 17A-17I illustrate schematic three-dimensional diagrams of various electronic building blocks that can be vertically connected with the multi-direction connectable electronic module consistent with some embodiments of the present disclosure.
Figure 17B:
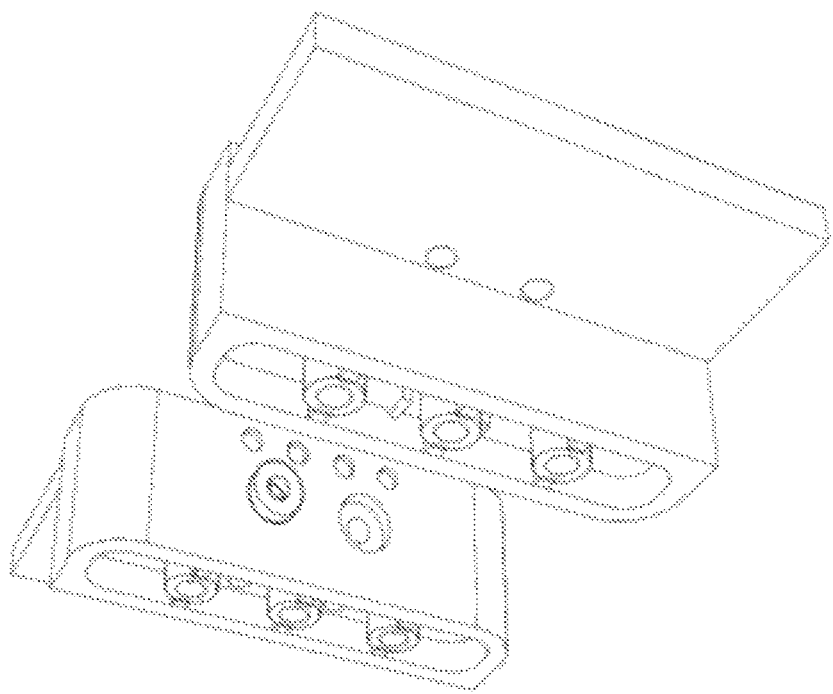
Figure 17C:
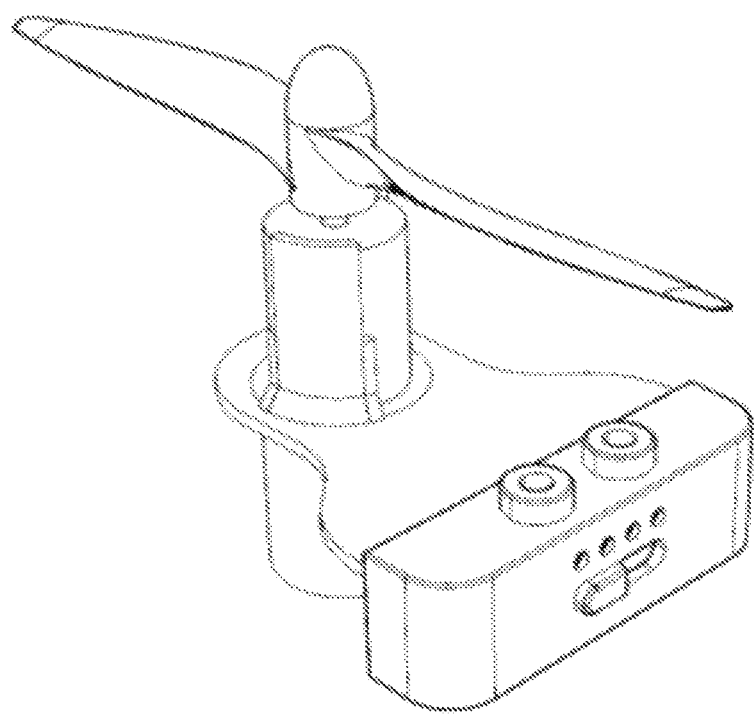
Figure 17D:
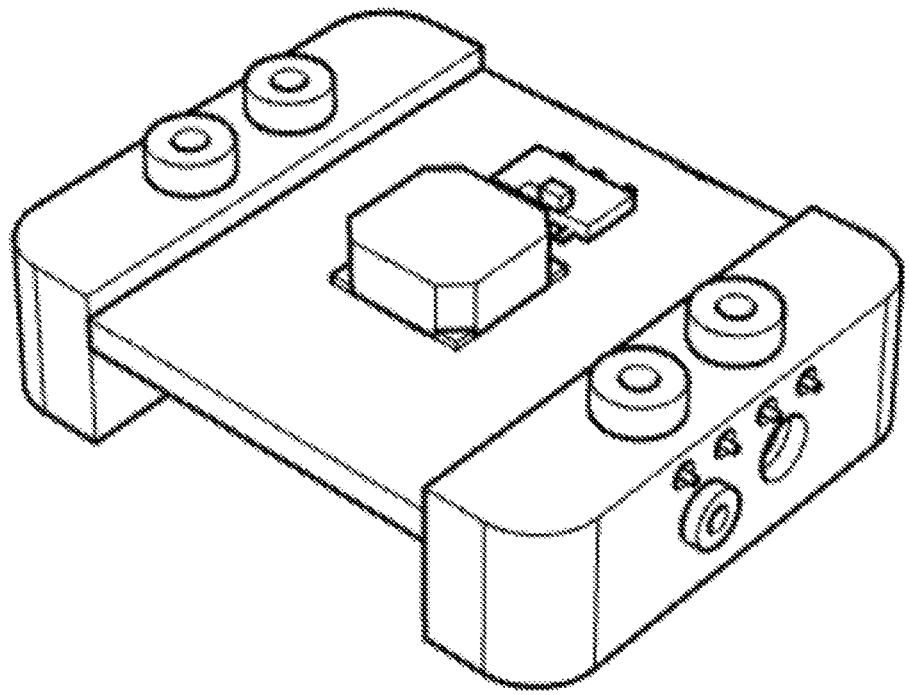
Figure 17E:
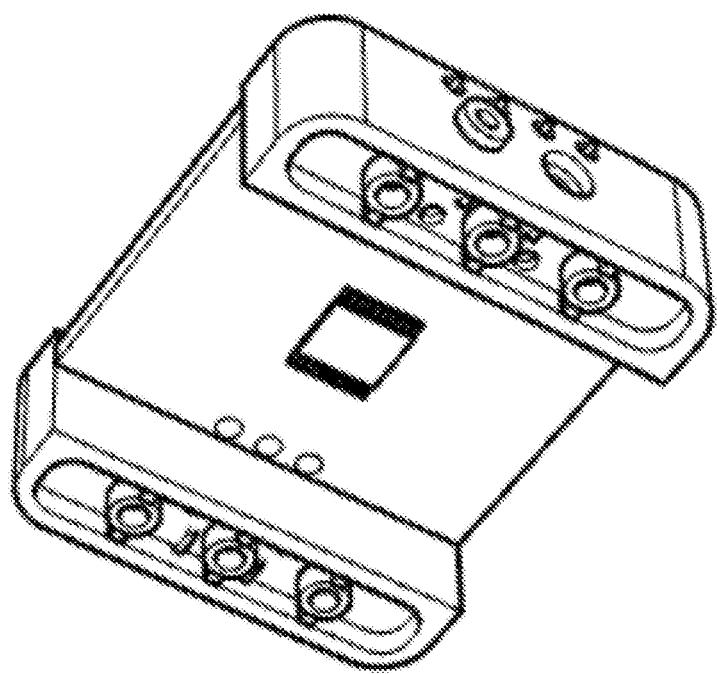
Figure 17F:
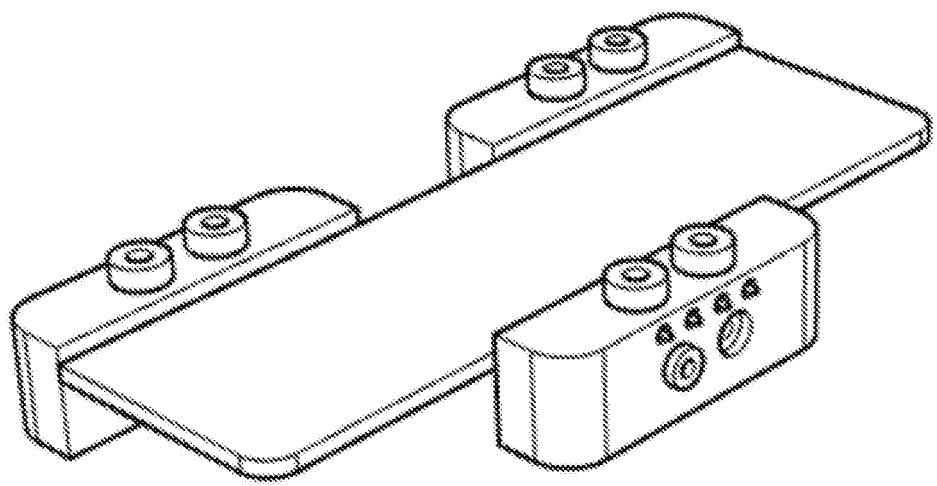
Figure 17G:
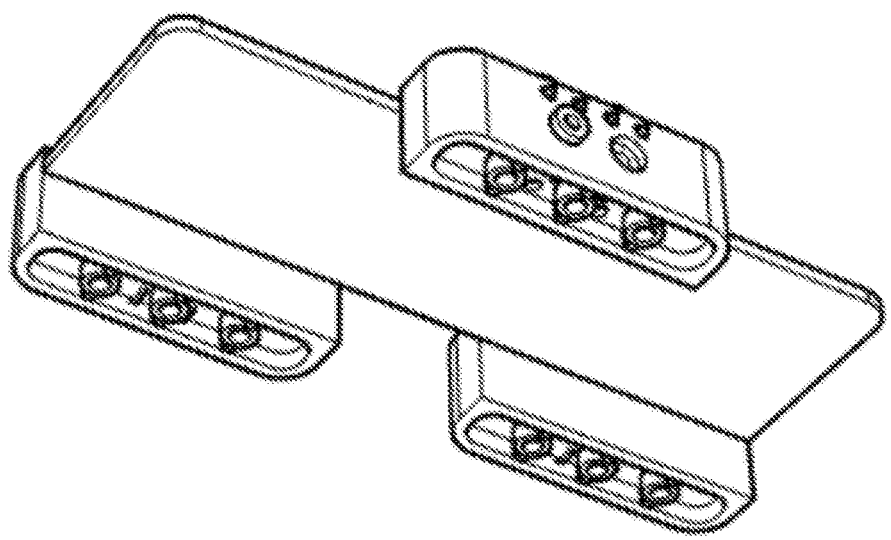
Figure 17:
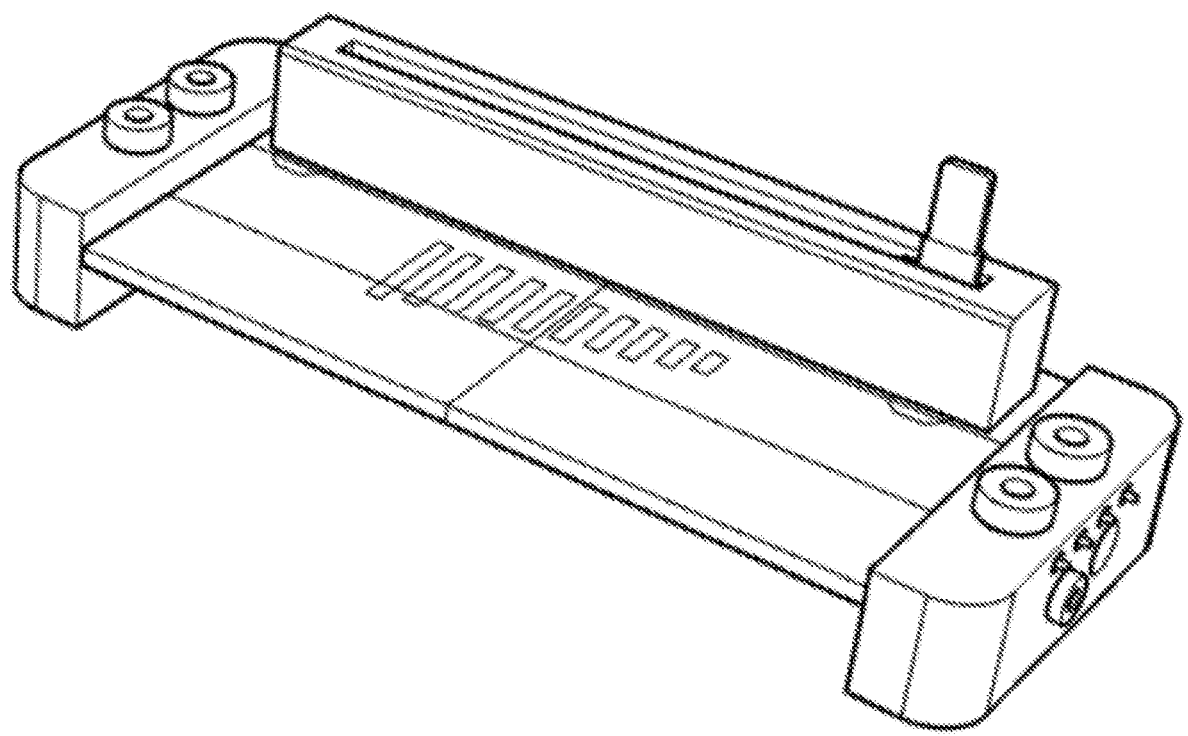
Figure 17I:
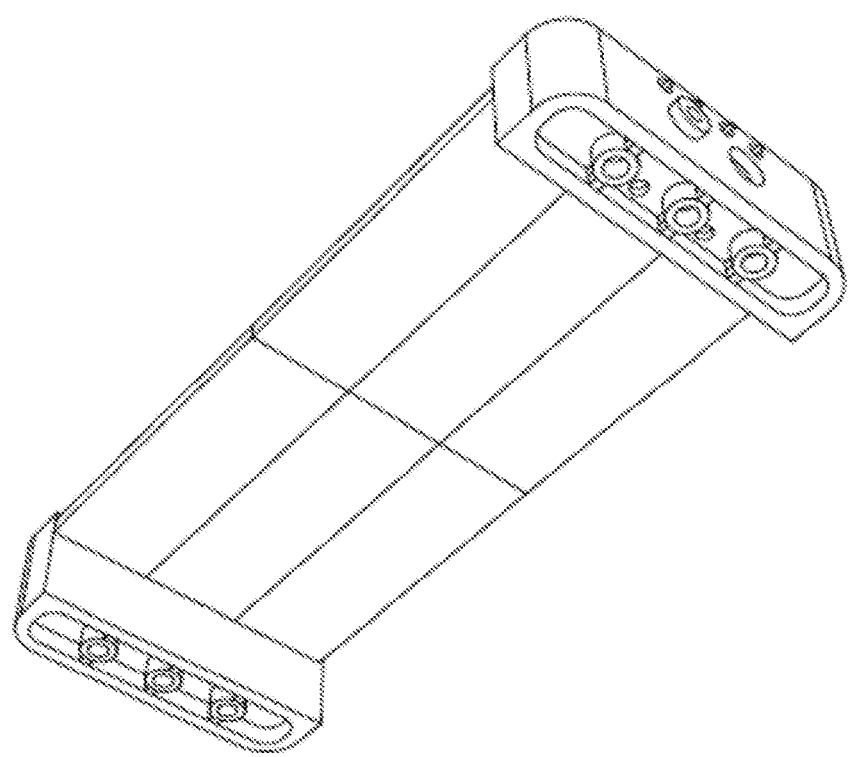

FIGS. 17A-17I illustrate schematic three-dimensional diagrams of various electronic building blocks that can be vertically connected with a multi-direction connectable electronic module consistent with some embodiments of the present disclosure. Referring to FIGS. 17A-17I, the lateral connection structures of the various forms of the second electronic building block 900 may all have structures similar to those shown in FIGS. 16A-16B. The second electronic building block 900 may have a rectangular shape or an irregular shape. As shown in FIG. 17C, based on the electronic building block shown in FIG. 17A or FIG. 17B, the circuit board may have an irregular shape and may be connected to a motor and a propeller. The electronic building blocks shown in FIGS. 17D-17I may be exemplary modules that can be laterally connected to the electronic module of the present disclosure. In addition, the electronic building blocks shown in FIGS. 17D-17I may also be considered as multi-direction connectable electronic modules 100 consistent with various embodiments of the present disclosure. The circuit boards of the electronic building blocks shown in FIGS. 17D-17E may include a plurality of electronic components such as buzzers, etc. In the electronic building blocks shown in FIGS. 17F-17G, the connectors may not be symmetrically arranged with respect to the circuit boards, and may be applied to various scenarios where connection requirements may be different. For example, the connectors may be used as wires. The electronic building blocks shown in FIGS. 17H-17I may include regulators and thus may be used as variable resistors. The pins of the second electronic building block 900 may also be arranged in a manner schematically shown in FIG. 15C.

Figure 18:
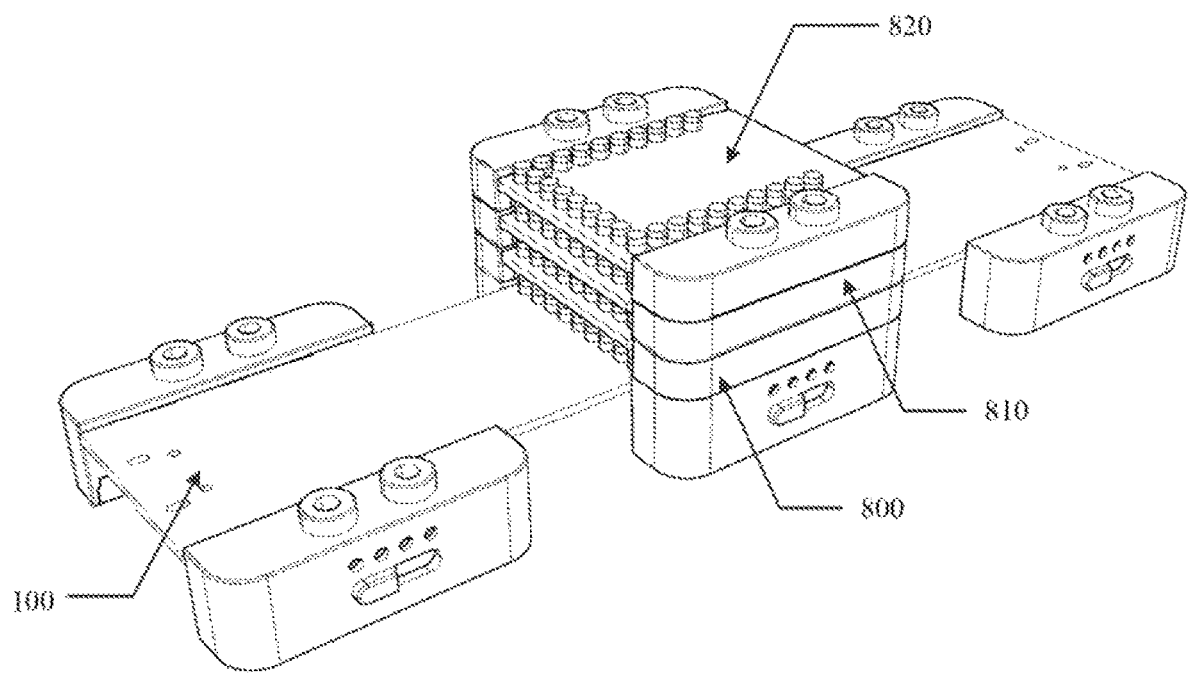
FIG. 18 illustrates a schematic three-dimensional diagram of another exemplary modular electronic building system consistent with some embodiments of the present disclosure.

FIG. 18 illustrates a schematic three-dimensional diagram of another exemplary modular electronic building system consistent with some embodiments of the present disclosure. Referring to FIG. 18, a scenario where the electronic module 100 shown in FIG. 9 is connected to a first electronic building block 800 is provided. As shown in FIG. 18, the longitudinal inter-locking parts 24 of the two connectors that are symmetrically arranged in the electronic module 100 may be respectively connected to the trenches in the corresponding longitudinal inter-locking parts of the first electronic building block 800. In the meantime, the two longitudinal magnetic connectors 21 at the top surfaces of the two connectors may be magnetically attracted by the magnets at the bottom surface of the first electronic building block 800 such that the connection between the two connectors and the first electronic building block 800 may be reinforced. The longitudinal pin connector 31 on the circuit board 1 may be interconnected with the pin connector of the first electronic building block 800 to establish electrical connection. In addition, other appropriate electronic building blocks may be further stacked vertically on the top of the first electronic building block 800, and electronically connected to the first electronic building block 800. For example, as shown in FIG. 18, an electronic building block 810 together with another electronic building block 820 may be sequentially stacked on the top of the first electronic building block 800 along the longitudinal direction. The electronic building block 810 and the electronic building block 820 may also be electrically connected to the first electronic building block 800. That is, the electronic module 100 may be electrically connected to both the electronic building block 810 and the electronic building block 820 indirectly through the first electronic building block 800. As such, the MCU of the electronic module 100 may also be able to exchange data with the electronic building blocks 810 and 820.

Figure 19:
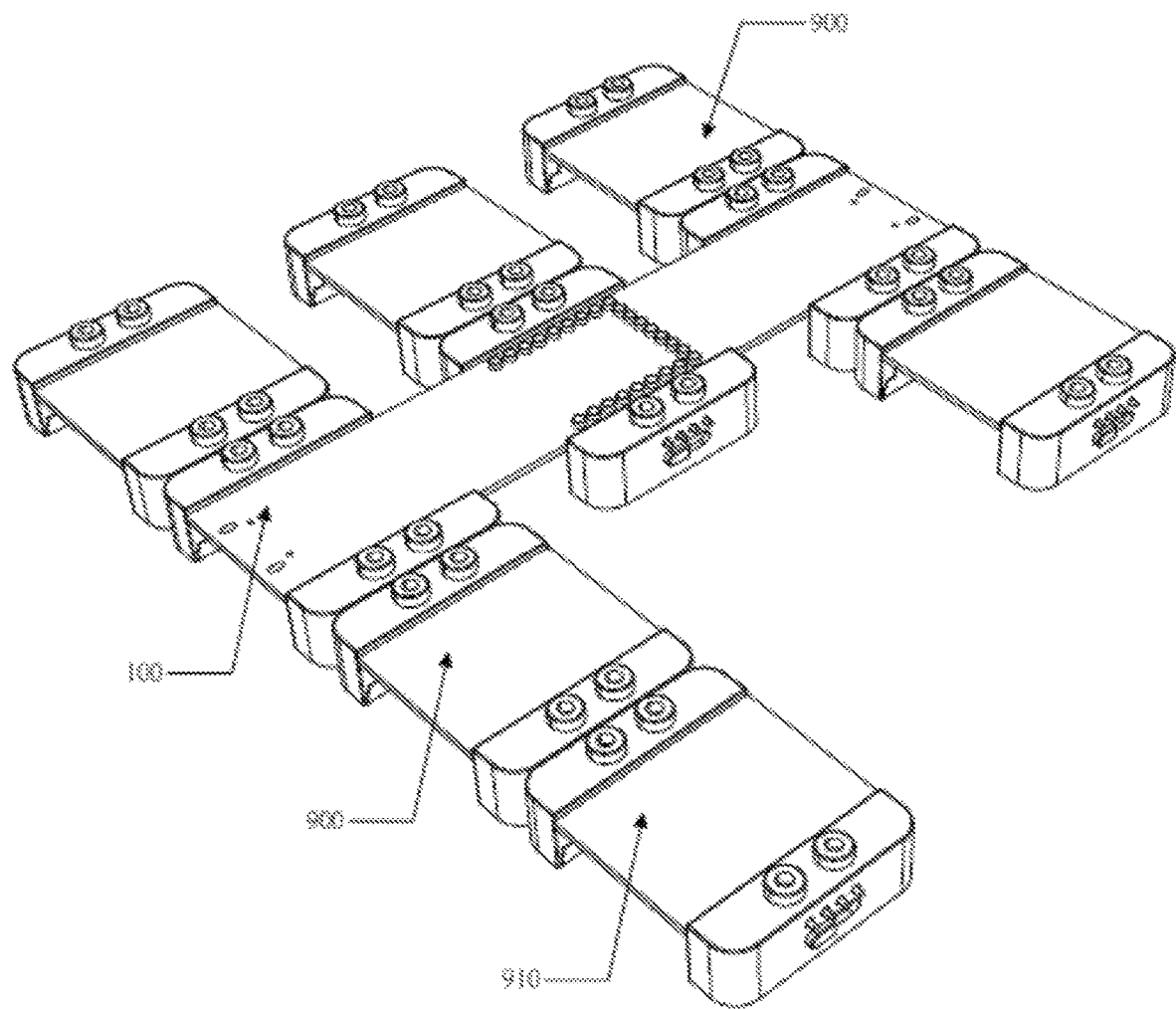
FIG. 19 illustrates a schematic three-dimensional diagram of another exemplary modular electronic building system consistent with some embodiments of the present disclosure.

FIG. 19 illustrates a schematic three-dimensional diagram of another exemplary modular electronic building system consistent with some embodiments of the present disclosure. In one embodiment, referring to FIG. 19, the electronic module 100 shown in FIG. 9 may be laterally connected to a plurality of electronic building blocks. For example, the electronic module 100 may be laterally and electronically connected to a second electronic building block 900, and another electronic building block 910 may be laterally and electronically connected to the second electronic building block 900. Therefore, the electrical connection between an electronic building block 910 and the electronic module 100 may be established in an indirect manner. That is, the MCU of the electronic module 100 may also control the electronic building block 910, and thus the MCU may exchange data with the electronic building block 910.

Figure 20:
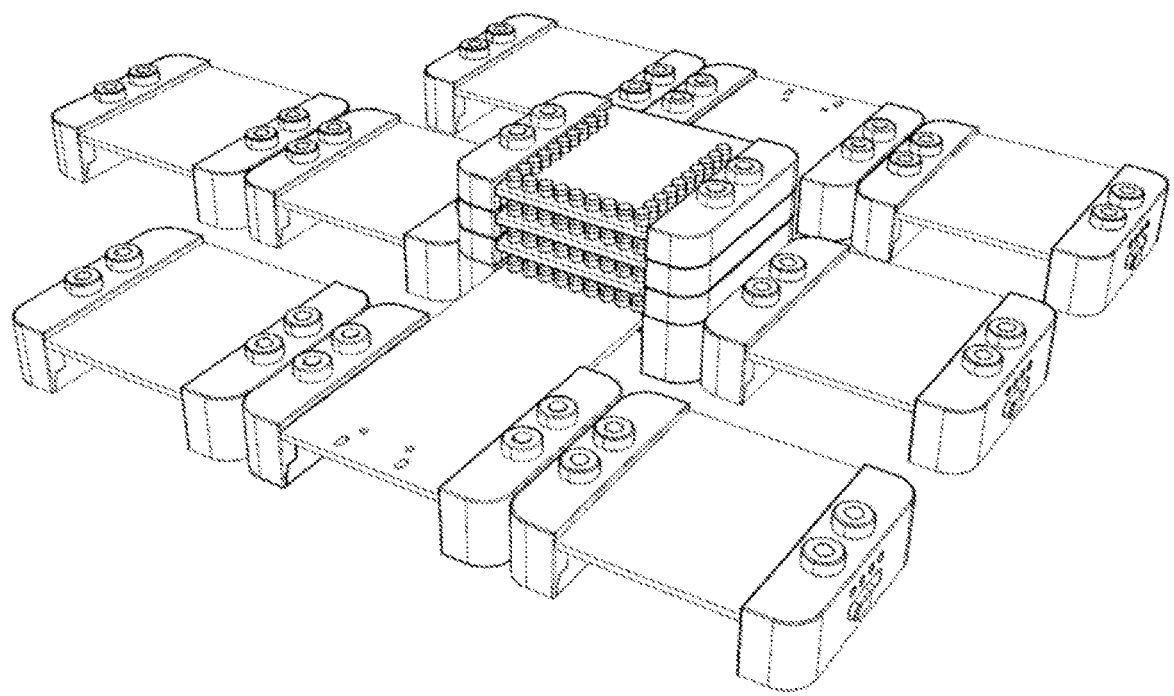
FIG. 20 illustrates a schematic three-dimensional diagram of another exemplary modular electronic building system consistent with some embodiments of the present disclosure.

FIG. 20 illustrates a schematic three-dimensional diagram of another exemplary modular electronic building system consistent with some embodiments of the present disclosure. In one embodiment, referring to FIG. 20, the electronic module 100 shown in FIG. 9 may be vertically stacked with a first electronic building block 800 and also laterally connected to a second electronic building block 900. That is, the MCU of the electronic module 100 may not only be able to simultaneously control but also be able to exchange data with the vertically-stacked electronic building block 800 and the laterally-connected electronic building block 900. In some embodiments, the electronic module of the present disclosure may be vertically stacked with a plurality of electronic building blocks and also laterally connected to a plurality of electronic building blocks, and the MCU of the electronic module may be able to not only simultaneously control the plurality of vertically-stacked electronic building blocks and the plurality of laterally-connected electronic building blocks, but also exchange data with the plurality of vertically-stacked electronic building blocks and the plurality of laterally-connected electronic building blocks.

Figure 21:
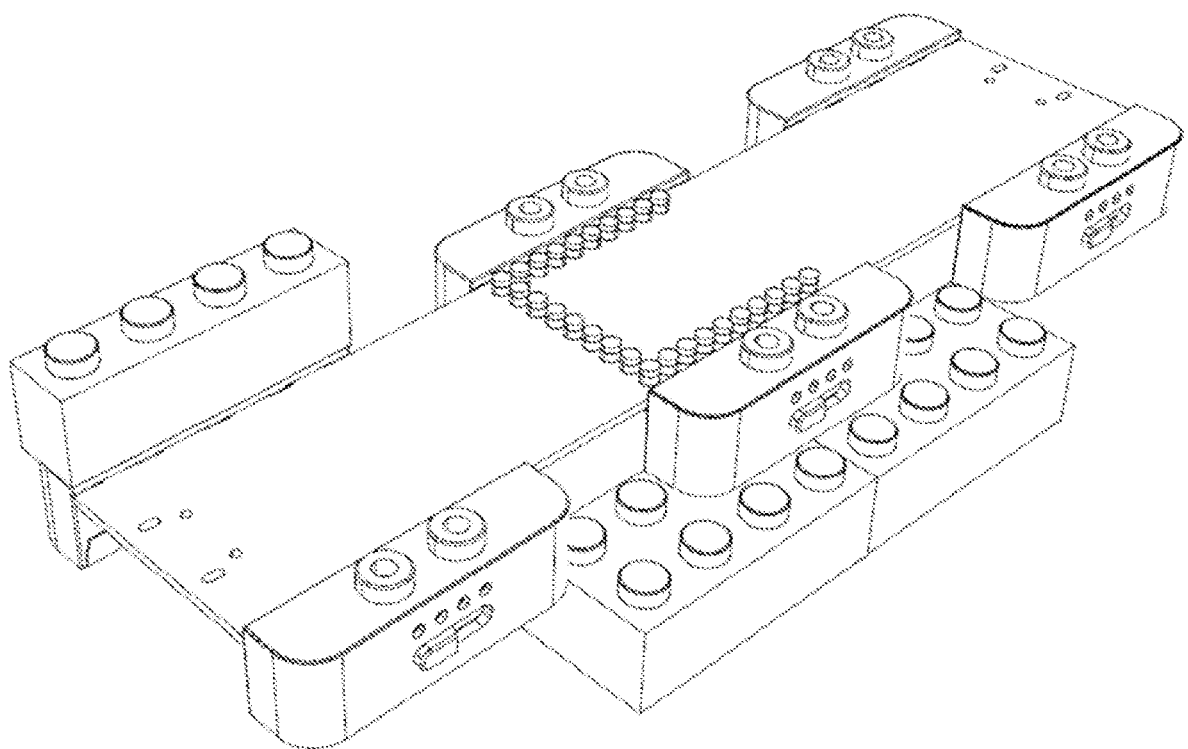
FIG. 21 illustrates a schematic three-dimensional diagram of another exemplary modular electronic building system consistent with some embodiments of the present disclosure.

FIG. 21 illustrates a schematic three-dimensional diagram of another exemplary modular electronic building system consistent with some embodiments of the present disclosure. In one embodiment, referring to FIG. 21, the electronic module 100 shown in FIG. 9 may be connected to a plurality of shape-matched toy building blocks (non-electronic building blocks). For example, the shapes and the positions of the top inter-locking structures 241 of one or more connectors 2 may be properly designed so that the insertion structures of the toy building blocks of a toy building block system, i.e., the LEGO® toy building block system, may be interconnected with the top inter-locking structures 241. As such, the toy building blocks can be fixed to the top of the electronic module. Alternatively, the shapes and the positions of the bottom inter-locking structures 242 of one or more connectors 2 may be properly designed so that the insertion structures of the toy building blocks of a toy building block system, i.e., the LEGO® toy building block system, may be interconnected with the bottom inter-locking structures 242. As such, the toy building blocks can be fixed to the bottom of the electronic module.

As illustrated above, the modular electronic building system of the present disclosure may have a lot of room to expand, and may be used to construct various basic and complex products, such as sensors and/or interactive analog and digital circuits. The disclosed electronic modules may be reusable and can be rearranged. The disclosed electronic modules may be capable of building and/or implementing circuits with different scales: from small-scale and simple circuits to large-scale and complex circuits. Moreover, the disclosed electronic modules may also be precise enough that manipulation of the modules can lead to complex performance designs.

The electronic module 100 can be pre-programmed according to the application. As such, without any programming or electronics knowledge, a regular person in the art can construct a modular electronic building system as a complex product prototype or circuit. Therefore, different modules with different functions may be able to form different circuits through hundreds and thousands of combinations. Every component of the constructed system may work directly without any programming, welding, or circuit assembly. Users may be able to design the performance of circuits by manually manipulating the components without writing any code.

Figure 22:
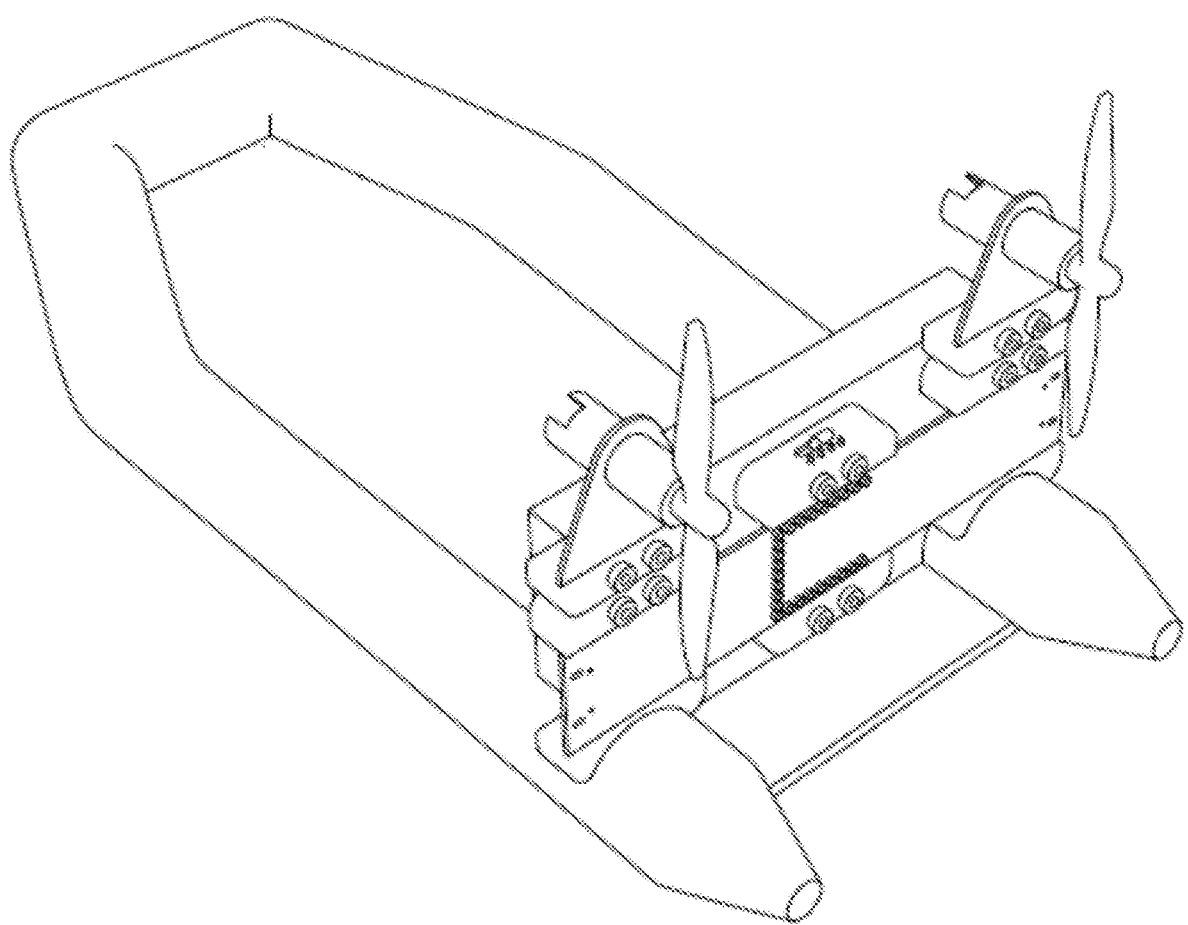
FIG. 22 illustrates a schematic three-dimensional diagram of applying an exemplary modular electronic building system consistent with some embodiments of the present disclosure to a steamship.

FIG. 22 illustrates a schematic three-dimensional diagram of applying an exemplary modular electronic building system consistent with some embodiments of the present disclosure to a steamship. Referring to FIG. 22, two motor modules (as shown in FIG. 17C) may be connected to a same side 13 of the electronic module shown in FIG. 9, and the other side of the electronic module may be connected to the body of the steamship. The electronic module may stand sideways. The electronic module may be able to receive remote control signals (such as signals from a joystick or a wireless remote). For example, after receiving a start signal, the motor may be started and the propeller may rotate. The wind generated by the propeller may be used as the drive force. When a control program is loaded, a remote-control toy ship may be formed.

Figure 23A:
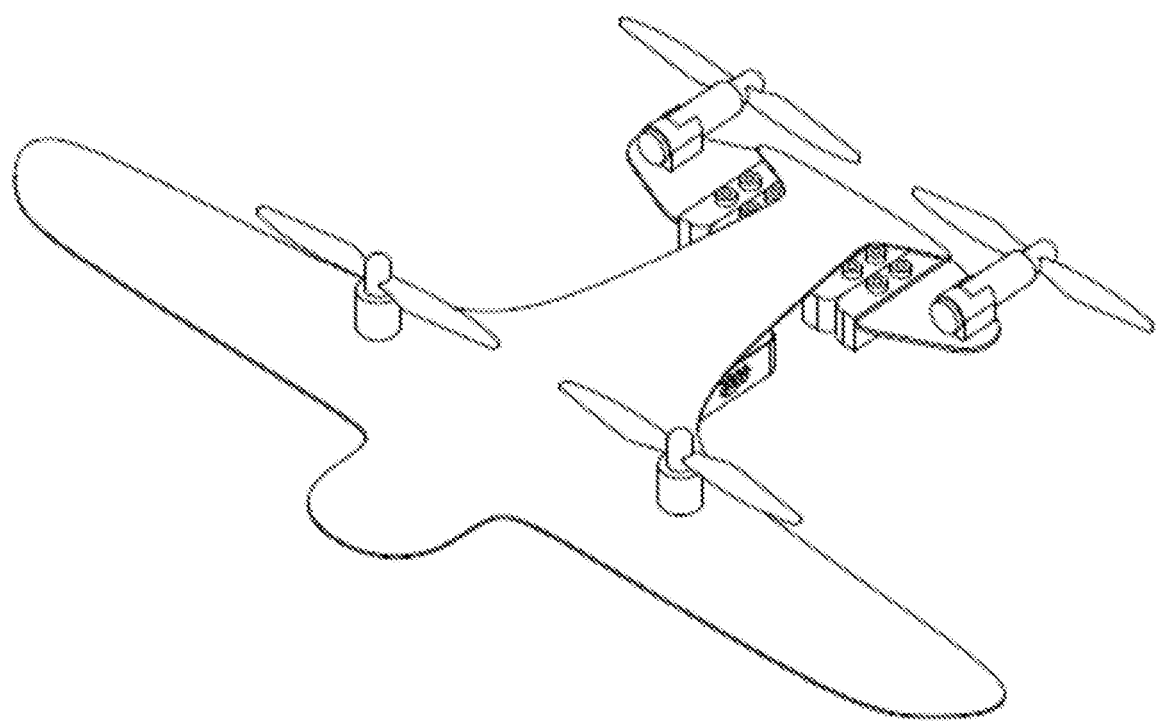
FIGS. 23A-23B illustrate schematic three-dimensional diagrams of applying an exemplary modular electronic building system consistent with some embodiments of the present disclosure to a wing-fixed aircraft.
Figure 23B:
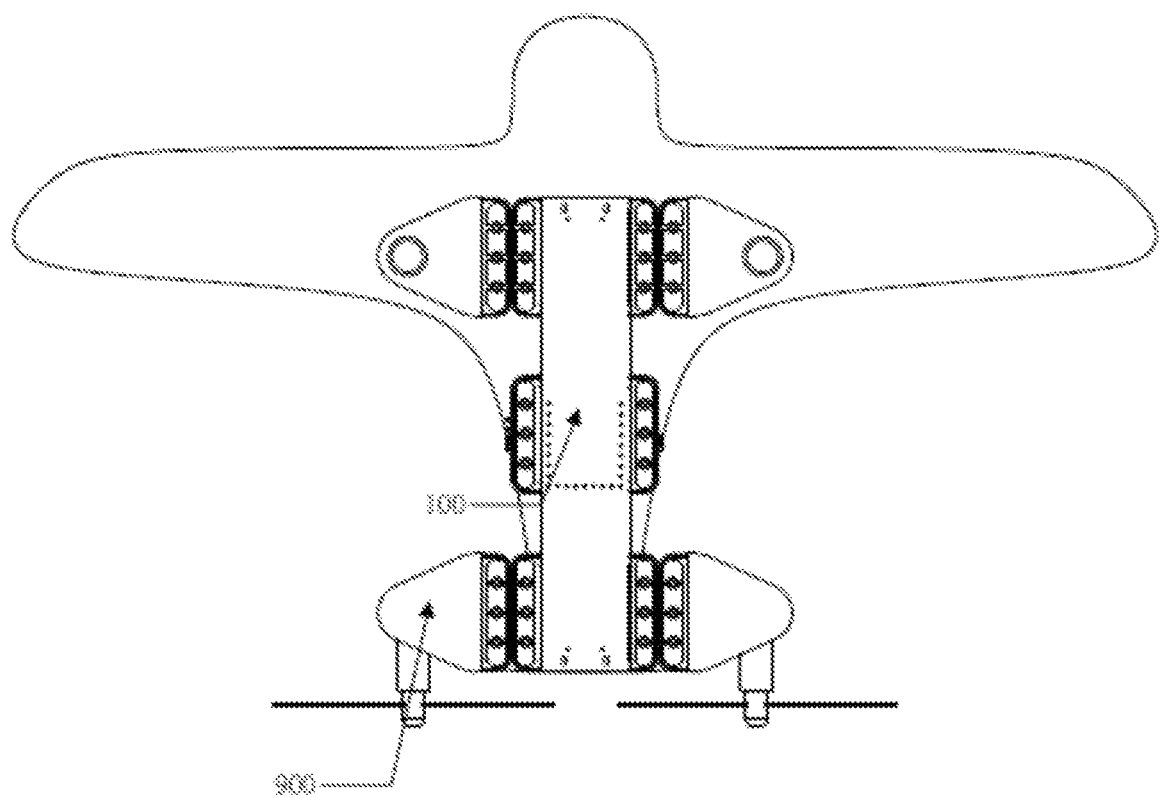

FIGS. 23A-23B illustrate schematic three-dimensional diagrams of applying an exemplary modular electronic building system consistent with some embodiments of the present disclosure to a wing-fixed aircraft. Referring to FIGS. 23A-23B, the aircraft may include four motor modules. Each motor module may include a laterally-connected electronic building block 900 and a propeller, and may be connected to the side of a core module 100. The core module 100 may be able to drive the four motors. Two of the propellers may provide a forward force in the horizontal direction, and may be able to adjust the heading direction by controlling the difference in the rotation speeds of the two propellers. The other two propellers may provide an auxiliary lifting force in the vertical direction and may be able to adjust the roll and the pitch directions by controlling the difference in the rotation speeds of the two propellers.

Figure 24:
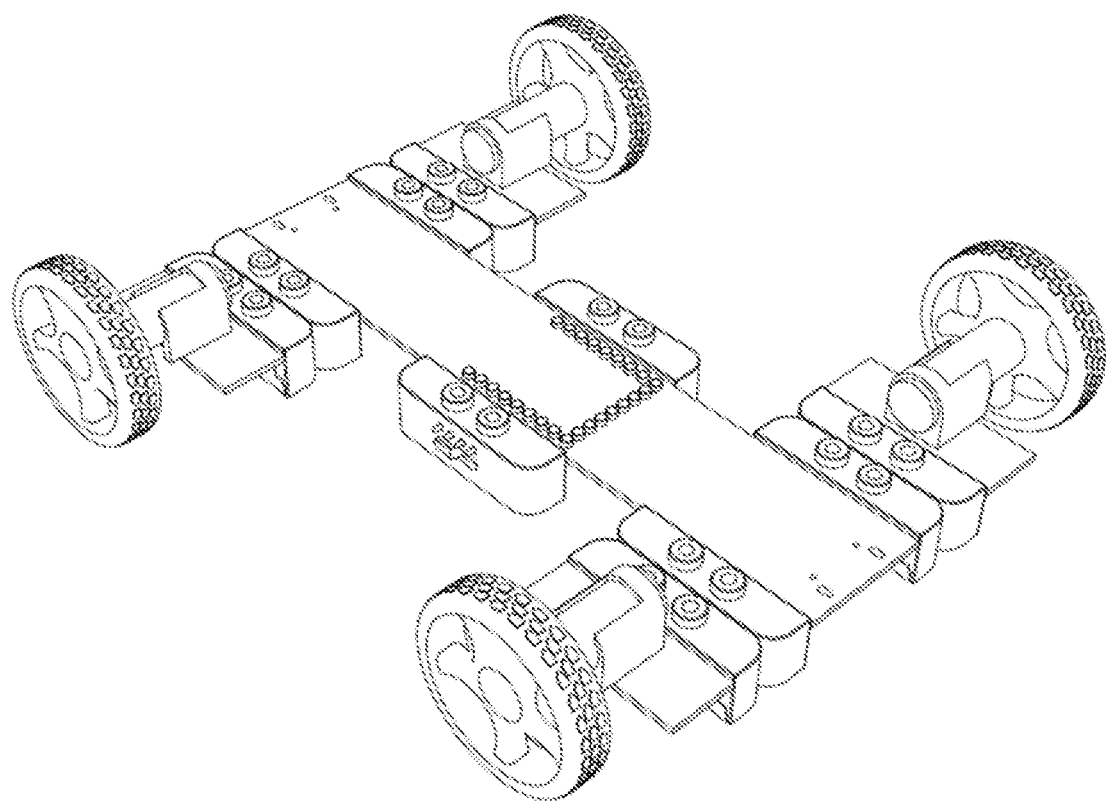
FIG. 24 illustrates a schematic three-dimensional diagram of applying an exemplary modular electronic building system consistent with some embodiments of the present disclosure to a four-wheel-drive vehicle.

FIG. 24 illustrates a schematic three-dimensional diagram of applying an exemplary modular electronic building system consistent with some embodiments of the present disclosure to a four-wheel-drive vehicle. Referring to FIG. 24, a four-wheel-drive vehicle may be formed by connecting four deceleration DC motor modules respectively to the four corners of the electronic module shown in FIG. 9. When a remote-car control program is loaded to the control unit, a remote control four-wheel-drive application may be implemented.

Figure 25:
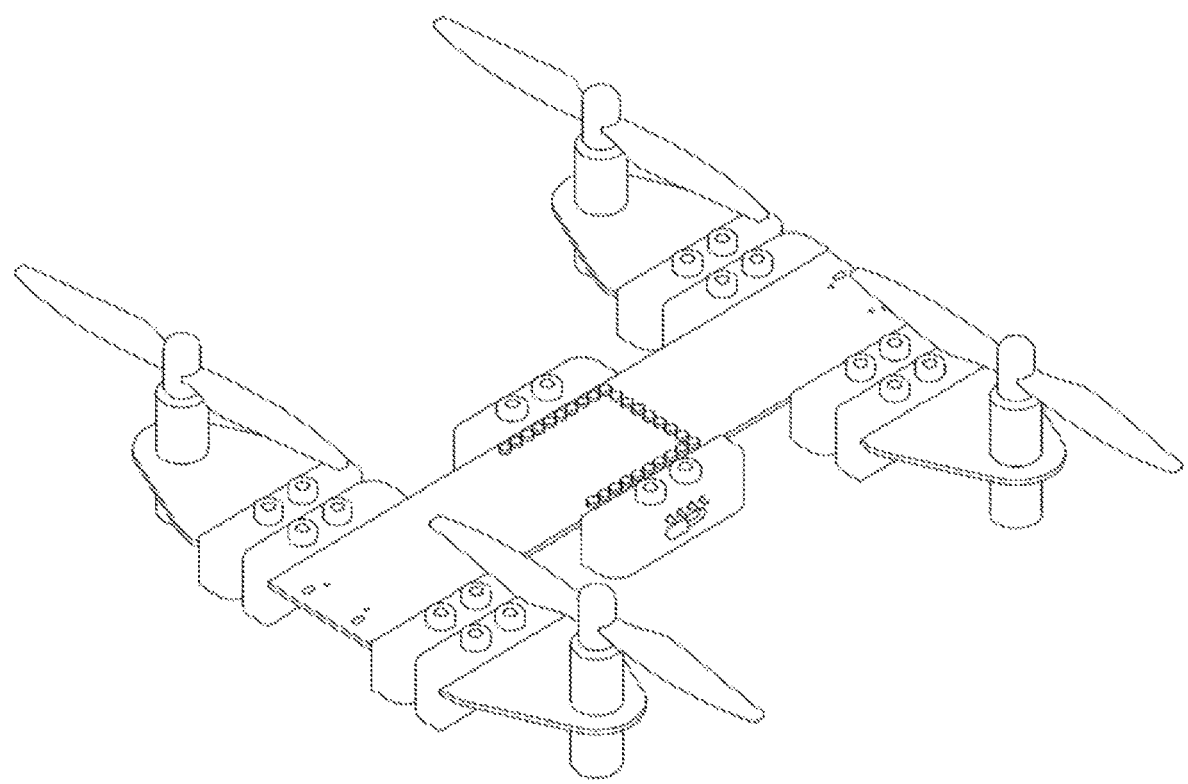
FIG. 25 illustrates a schematic three-dimensional diagram of applying an exemplary modular electronic building system consistent with some embodiments of the present disclosure to a four-axis drone.

FIG. 25 illustrates a schematic three-dimensional diagram of applying an exemplary modular electronic building system consistent with some embodiments of the present disclosure to a four-axis drone. Referring to FIG. 25, four motor modules (e.g., brushless motor modules), each including a laterally-connected electronic building block 900, may be connected to the four corners of the electronic module shown in FIG. 9, and a drone control program may be loaded. As such, flight remote control may be achieved. In some embodiments, various electronic components such as sensors may also be integrated on the circuit board. Moreover, the four-axis drone shown in FIG. 25 may have various functions, including automatic obstacle avoidance, motor speed indication, altitude indication, automatic attitude adjustment, etc.

Further, a drone with complex functions can also be built based on the system shown in FIG. 25. For example, FIG. 26 illustrates a schematic three-dimensional diagram of applying an exemplary modular electronic building system consistent with some embodiments of the present disclosure to a four-axis drone.

Figure 26:
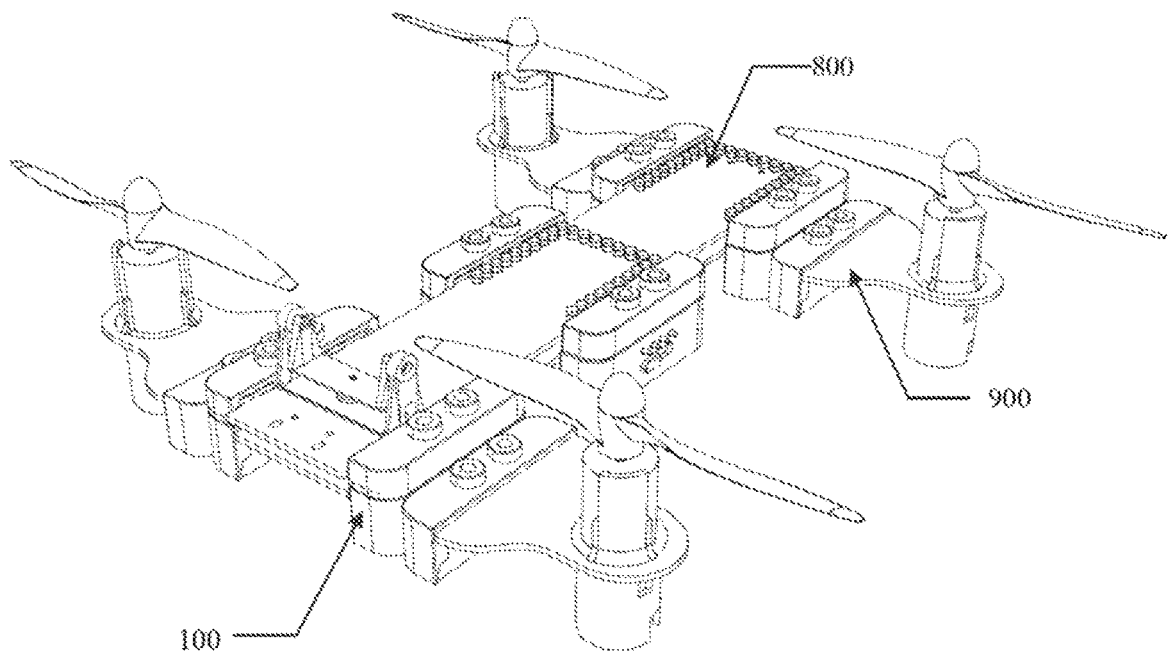
FIG. 26 illustrates a schematic three-dimensional diagram of applying another exemplary modular electronic building system consistent with some embodiments of the present disclosure to a four-axis drone.

Referring to FIG. 26, one or more vertically-stacked electronic building blocks 800 (e.g., extension boards) may be connected to the corresponding longitudinal pin connectors 31 (U-type 27-pin connectors). Further, a plurality of external devices such as tripod head, camera, etc. may be installed on the extension boards. The plurality of external devices may be electrically connected to the MCU of the electronic module 100 and may be able to exchange data with the MCU through the extension boards. A drone control program may be loaded to remotely control the flight of the drone. In addition, the drone may be able to take pictures or record videos and send the images back to the smart terminal that is wirelessly connected to the electronic module 100.

Figure 27:
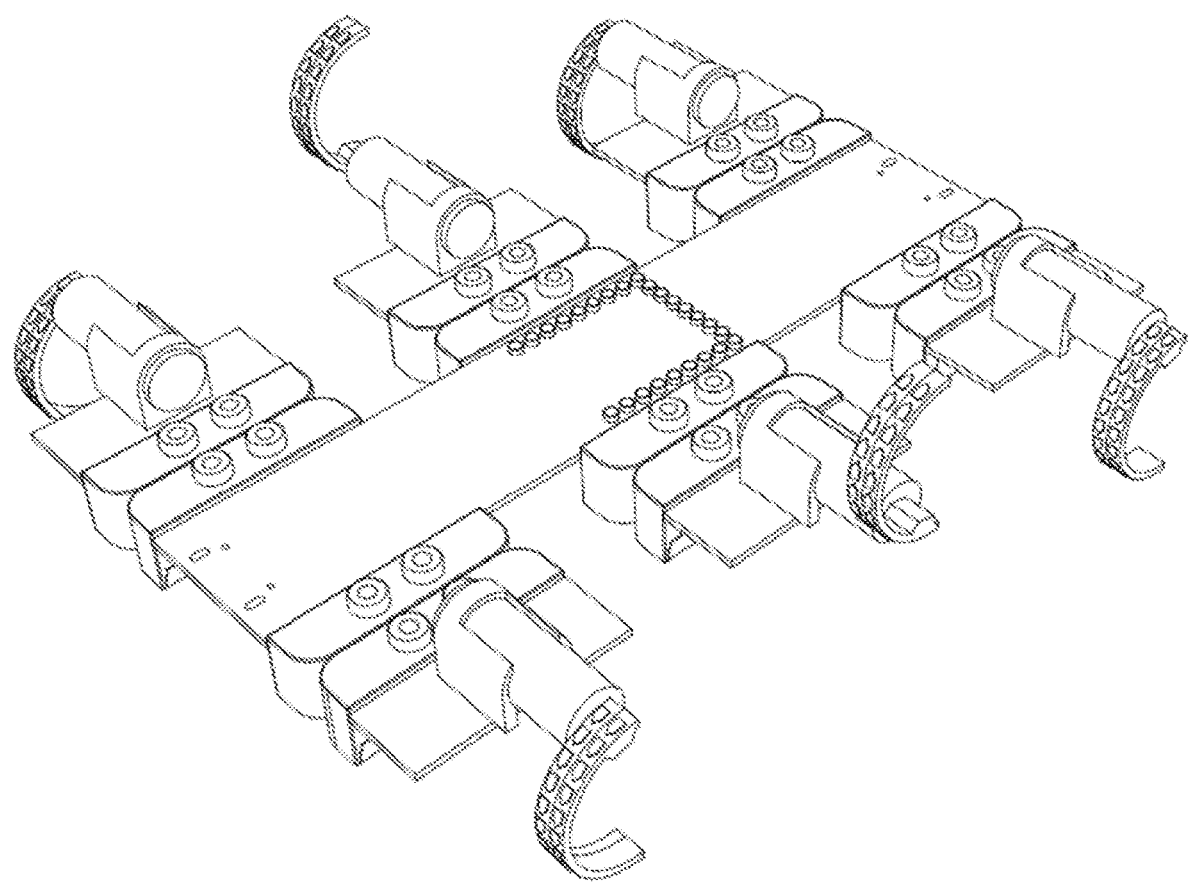
FIG. 27 illustrates a schematic three-dimensional diagram of applying an exemplary modular electronic building system consistent with some embodiments of the present disclosure to a hexapod robot.

FIG. 27 illustrates a schematic three-dimensional diagram of applying an exemplary modular electronic building system consistent with some embodiments of the present disclosure to a hexapod robot. Similar to the exemplary four-wheel-drive vehicle illustrated above, six motor modules may be respectively connected to the six connectors of the electronic module shown in FIG. 27 to form six feet. The move of each foot can be separately controlled, and through the control of each foot, the action of the hexapod robot may be controlled. Moreover, the electronic module may also have a distance measurement function, such that the hexapod robot can automatically determine road conditions and thus avoid obstacles when the hexapod robot moves.

Figure 28:
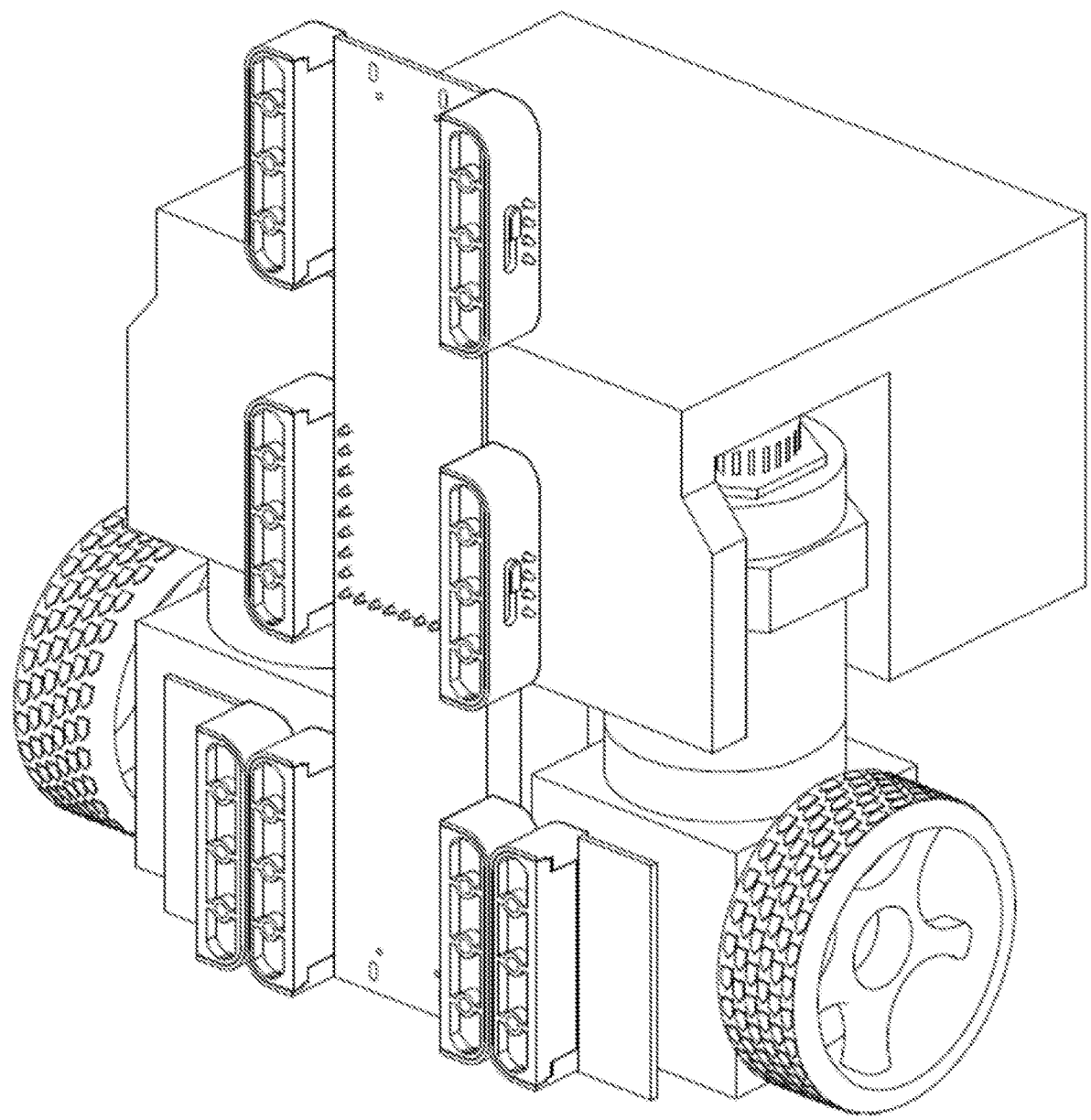
FIG. 28 illustrates a schematic three-dimensional diagram of applying another exemplary modular electronic building system consistent with some embodiments of the present disclosure to a two-wheel-drive vehicle.

FIG. 28 illustrates a schematic three-dimensional diagram of applying another exemplary modular electronic building system consistent with some embodiments of the present disclosure to a two-wheel-drive vehicle (i.e., a balance car). Referring to FIG. 28, a high-power deceleration DC motor support module may be connected to the connectors that are symmetrically arranged on one side of the electronic module shown in FIG. 9. A program for car balance control may be loaded. The two-wheel-drive vehicle may have only two motors and only two wheels. By remotely controlling the two motors and two wheels, balance of the circuit board and the shell that the two-wheel-drive car likely has may be achieved, and the forward, backward, or steering moving of the two-wheel-drive car may be realized. In this application, the motor modules of the two-wheel-drive car may be different from that in the four-wheel-drive vehicle, drone, etc. For example, the motor module may include components for measuring the rotation speed of the motor and thus the motor module may be able to accurately control the rotation angle of the motor.

As illustrated above, the electronic modules according to the present disclosure may conveniently realize various functions and connect with each other. In addition, through the connection method described in the present disclosure, the electronic modules may be able to not only extend in the vertical direction but also extend in the lateral direction. The angle between different modules may be adjusted according to the preferences or practical needs of the user/player/producer. As such, the disclosed electronic modules and connection methods may provide a lot of creation space and entertainment for system construction.

The modular electronic building system can be used to provide game, creation, and design spaces for both minors and adults. The modular electronic building system may easily incorporate necessary electronic modules into toys, projects and projects. As such, a stand-alone module may allow users with little or no electronics or programming experience to construct basic and complex products such as sensors and/or interactive analog and digital circuits. The disclosed electronic modules may be reusable and can be rearranged. The disclosed electronic modules may be capable of building and/or implementing circuits with different scales: from small-scale and simple circuits to large-scale and complex circuits. Moreover, the disclosed electronic modules may also be precise enough that manipulation of the modules can lead to complex performance designs.

Further, a series of electronic components formed by the disclosed electronic modules may be used to create larger and more complex components or systems. In fact, a user/player/manufacturer can almost infinitely expand the series of the modules and may add any necessary new components to the existing module library. Users can even create their own modules and add these modules to their own collections.

In some embodiments, a modular electronic build system that contains a required number of modules can be commercialized as a single set of products or as a single combination of products. The single set of products may include one or more different modules or different types of modules, and may also include containers for storing these modules. Further, the single set of products may also include accessories, instructional materials, or other suitable components. A single set of products may include multiple modules that are intended to be assembled in several combinations (including a single combination) and perform various functions. A single set of products may also be designed for a particular age group, for example, products for kids at the elementary school level may include fewer and/or less complex modules than products for teenagers at the high school level.

Therefore, different modules with different functions may be able to form different circuits through hundreds and thousands of combinations. Every component of the constructed system may work directly without further programming, welding, or circuit assembly. Users may be able to design the performance of circuits by manually manipulating the components without writing any code.

Pre-programmed and pre-assembled modules can be selected in the series of modules, and thus, without programming or electronics knowledge, a person with ordinary skill in the art can construct a modular electronic building system as a complex product prototype or circuit. In addition, each module may have a unique color to further distinguish the modules and provide better experience for users.

Further, without any need of expertise in programming logic and circuit construction, users may be able to use specific applications to copy pre-written code to modules, and thus create their own functional modules. For example, all required program code may be prepared in advance so that the users can copy and paste the program code into a module that has a Bluetooth connection function for connecting to a network (e.g., a website).

Furthermore, light emitting components, sounding components, buttons, and other electronic components can be added to products or devices such that children, young students, designers, non-engineers, and others without the necessary experience can easily operate the products or the devices. Therefore, in a cost-effective manner, the electronic products may be easier to understand and apply for non-professionals. The disclosed electronic modules and modular electronic building systems provide a platform for improving learning, experimentation, and innovation.

Compared to existing electronic modules and modular electronic building systems, the disclosed electronic module and electronic building system for multi-directional connection may demonstrate the following advantages.

The electronic module according to the present disclosure can be connected with other building blocks in multiple directions (including both the longitudinal direction and the lateral direction). The disclosed electronic module may be magnetically and/or electrically connected to other building blocks.

The electronic module according to the present disclosure can be sued as a control core for the modular electronic building system. As such, without welding/soldering circuit wires or plugging wire connectors, the electronic module together with a plurality of peripheral components can be used to form a four-axis drone, a robotic arm, etc.

Moreover, according to the connection methods provided in the present disclosure, each electronic module may be able to extend in both the vertical direction and the lateral direction. The building blocks stacked with or connected to the disclosed electronic module may be selected according to the preferences or needs of the user/player/producer. The building blocks may be electronic building blocks or regular toy building blocks, which provide a lot of creation space and entertainment for system construction.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A multi-direction connectable electronic module, comprising:

a circuit board, including a top surface, a bottom surface, and at least one side between the top surface and the bottom surface; and a plurality of connectors, connected to the at least one side of the circuit board and each including a lateral magnetic connector, a shell, a longitudinal inter-locking part, and a lateral inter-locking part, wherein:

the lateral inter-locking part includes a protruding structure and a recessed structure located on an outer side surface of the shell, and is configured to connect with a first electronic building block along a lateral direction;

the longitudinal inter-locking part includes a top inter-locking structure protruding from a top surface of the shell and a bottom inter-locking structure recessed into a bottom surface of the shell, and is configured to connect with a second electronic building block that is stacked longitudinally on a top or a bottom of the electronic module;

the lateral magnetic connector is disposed in the shell and configured to magnetically connect with the first electronic building block along the lateral direction;

a plurality of through holes are formed on an outer side surface of the shell;

a lateral pin connector is disposed on the at least one side of the circuit board, wherein the lateral pin connector includes a plurality of pins located at positions corresponding to the plurality of through holes, and is configured to electrically connect the first electronic building block along the lateral direction; and the circuit board includes at least one microcontroller unit (MCU), and one or more of functional electronic components and electronic chips that are connected to the at least one MCU; a longitudinal pin connector and the lateral pin connector are electrically connected with corresponding pins of the at least one MCU; a side width of the at least one side of the circuit board is larger than a side width of the connector; and one of the at least one side of the circuit board is connected to at least two connectors.

2. The electronic module according to claim 1, further including:

a longitudinal magnetic connector, disposed in the shell and configured to magnetically connect with the second electronic building block along a vertical direction, wherein:

the longitudinal pin connector is disposed on the circuit board and configured to electrically connect with the second electronic building block along the vertical direction.

3. The electronic module according to claim 2, wherein:

a shape of the top inter-locking structure and a shape of the bottom inter-locking structure complementarily match with each other; and a shape of the protruding structure and a shape of the recessed structure complementarily match with each other.

4. The electronic module according to claim 2, wherein:
the longitudinal pin connector is arranged symmetrically on the top surface and the bottom surface of the circuit board, and is separated from the connector.

5. The electronic module according to claim 1, wherein:
the lateral pin connector is a pogo type pin connector including a plurality of pins penetrating through the plurality of through holes and protruding from the outer side surface of the shell, or is a flat-contact type lateral pin connector.

6. The electronic module according to claim 1, wherein:
the circuit board has a rectangular shape and includes four sides; and
two opposite sides of the circuit board are respectively connected to at least two connectors.

7. The electronic module according to claim 1, wherein:
the lateral pin connector includes four contacts respectively connected to a power supply, a ground, a data line, and a high-power output; and
the electronic module provides electric power to the first electronic building block connected along the lateral direction through the lateral pin connector.

8. The electronic module according to claim 7, wherein the at least one MCU includes:
two MCUs with a first MCU having an operation voltage different from an operation voltage of a second MCU;
a first voltage converter, arranged at a connecting position between the first MCU and the second MCU;
a two-way communication between the first MCU and the second MCU is conducted through the first voltage converter; and
the first MCU is a master control unit, and one or more functional electronic components are connected to the second MCU, wherein the one or more functional electronic components exchange signals with the first MCU through the second MCU.

9. The electronic module according to claim 8, wherein:
the circuit board further includes an analog switch electrically connected to the second MCU, wherein the analog switch is controlled by digital signals sent from the second MCU to switch the electronic module between multiple operation modes.

10. The electronic module according to claim 8, wherein:
each connector corresponds to a set of lateral pin connectors;
the electronic board further includes an analog-to-digital (A/D) converter and a digital-to-analog (D/A) converter, both electrically connected to the second MCU;
the first electronic building block connected along the lateral direction is an input-type electronic building block or an output-type electronic building block;
the lateral pin connector electrically connected to the input-type electronic building block includes a pin connected to the A/D converter for receiving input signals of the input-type electronic building block; and
the lateral pin connector electrically connected to the output-type electronic building block includes a contact connected to the D/A converter for sending output signals to the output-type electronic building block.

11. The electronic module according to claim 8, wherein:
the circuit board further includes a second voltage converter electrically connected to the first MCU; and
the lateral pin connector includes a contact connected to the second voltage converter for receiving input digital signals from or sending output digital signals to the electronic building block connected along the lateral direction.

12. The electronic module according to claim 8, wherein:
the longitudinal pin connector is electrically connected to the first MCU for receiving input digital signals from or sending output digital signals to the second electronic building block connected along the vertical direction.

13. A multi-direction connectable electronic module, comprising:

a circuit board, including a top surface, a bottom surface, and at least one side between the top surface and the bottom surface; and
a plurality of connectors, connected to the at least one side of the circuit board and each including a lateral magnetic connector, a shell, a longitudinal inter-locking part, and a lateral inter-locking part, wherein:
the lateral inter-locking part includes a protruding structure and a recessed structure located on an outer side surface of the shell, and is configured to connect with a first electronic building block along a lateral direction;
the longitudinal inter-locking part includes a top inter-locking structure protruding from a top surface of the shell and a bottom inter-locking structure recessed into a bottom surface of the shell, and is configured to connect with a second electronic building block that is stacked longitudinally on a top or a bottom of the electronic module;
the lateral magnetic connector is disposed in the shell and configured to magnetically connect with the first electronic building block along the lateral direction;
a plurality of through holes are formed on an outer side surface of the shell;
a lateral pin connector is disposed on the at least one side of the circuit board, wherein the lateral pin connector includes a plurality of pins located at positions corresponding to the plurality of through holes, and is configured to electrically connect the first electronic building block along the lateral direction;
the circuit board includes at least one microcontroller unit (MCU), and one or more of functional electronic components and electronic chips that are connected to the at least one MCU; a longitudinal pin connector and the lateral pin connector are electrically connected with corresponding pins of the at least one MCU; and
the at least one MCU has a wireless communication control function for transmitting control signals and feedback signals to wirelessly-connected smart terminals.

14. The electronic module according to claim 13, wherein:
the one or more functional electronic components connected to the at least one MCU include one or more of temperature sensors, humidity sensors, light sensors, air quality sensors, human body sensors, color recognition sensors, proximity sensors, collision sensors, posture sensors, heart rate sensors, gesture sensors, ultrasonic sensors, Hall sensors, voice collectors, image collectors, switches, displays, media players, light-emitting diode (LED) lights, buzzers, speakers, and motors.

15. The electronic module according to claim 13, further including:
a longitudinal magnetic connector, disposed in the shell and configured to magnetically connect with the second electronic building block along a vertical direction, wherein:
the longitudinal pin connector is disposed on the circuit board and configured to electrically connect with the second electronic building block along the vertical direction.

16. The electronic module according to claim 13, wherein:

a shape of the top inter-locking structure and a shape of the bottom inter-locking structure complementarily match with each other; and a shape of the protruding structure and a shape of the recessed structure complementarily match with each other.

17. The electronic module according to claim 13, wherein:

the longitudinal pin connector is arranged symmetrically on the top surface and the bottom surface of the circuit board, and is separated from the connector, and the lateral pin connector is a pogo type pin connector including a plurality of pins penetrating through the plurality of through holes and protruding from the outer side surface of the shell or is a flat-contact type lateral pin connector.

18. A modular electronic building system, comprising:

a multi-direction connectable electronic module, including:

a circuit board, including a top surface, a bottom surface, and at least one side between the top surface and the bottom surface; and a plurality of connectors, connected to the at least one side of the circuit board and each including a lateral magnetic connector, a shell, a longitudinal inter-locking part, and a lateral inter-locking part, wherein:

the lateral inter-locking part includes a protruding structure and a recessed structure located on an outer side surface of the shell, and is configured to connect with a first electronic building block along a lateral direction;

the longitudinal inter-locking part includes a top inter-locking structure protruding from a top surface of the shell and a bottom inter-locking structure recessed into a bottom surface of the shell, and is configured to connect with a second electronic building block that is stacked longitudinally on a top or a bottom of the electronic module;

the lateral magnetic connector is disposed in the shell and configured to magnetically connect with the first electronic building block along the lateral direction;

a plurality of through holes are formed on an outer side surface of the shell;

a lateral pin connector is disposed on the at least one side of the circuit board, wherein the lateral pin connector includes a plurality of pins located at positions corresponding to the plurality of through holes, and is configured to electrically connect the first electronic building block along the lateral direction; and the circuit board includes at least one microcontroller unit (MCU), and one or more of functional electronic components and electronic chips that are connected to the at least one MCU; a longitudinal pin connector and the lateral pin connector are electrically connected with corresponding pins of the at least one MCU; a side width of the at least one side of the circuit board is larger than a side width of the connector; and one of the at least one side of the circuit board is connected to at least two connectors, at least one first electronic building block, each connected to a connector of the multi-direction connectable electronic module along the lateral direction, and including a first lateral inter-locking part, a first magnet, and a first lateral pin connector, wherein:

the first lateral inter-locking part is configured to interlock with the lateral inter-locking part of the multi-direction connectable electronic module;

the first magnet has a magnetic polarity opposite to a surface magnetic polarity of the lateral magnetic connector of the multi-direction connectable electronic module; and the first lateral pin connector is configured to interlock with the lateral pin connector of the multi-direction connectable electronic module.

19. The modular electronic building system according to claim 18 further including at least one second electronic building block vertically stacked with the multi-direction connectable electronic module, wherein:

the multi-direction connectable electronic module further includes:

a longitudinal magnetic connector, disposed in the shell and configured to magnetically connect with the second electronic building block along a vertical direction, wherein: the longitudinal pin connector is disposed on the circuit board and configured to electrically connect with the second electronic building block along the vertical direction; and each second electronic building block vertically stacked with the multi-direction connectable electronic module includes a second longitudinal inter-locking part, a second magnet, and a second longitudinal pin connector, wherein:

the second longitudinal inter-locking part is configured to interlock with the longitudinal inter-locking part of the multi-direction connectable electronic module;

the second magnet has a magnetic polarity opposite to a surface magnetic polarity of the longitudinal magnetic connector of the multi-direction connectable electronic module; and the second longitudinal pin connector is configured to interlock with the longitudinal pin connector of the multi-direction connectable electronic module.

20. The modular electronic building system according to claim 19, wherein:

the at least one MCU receives input signals from and sends output signals to the at least one second electronic building block vertically stacked with the multi-direction connectable electronic module through the longitudinal pin connector; and the at least one MCU receives input signals from and sends output signals to the at least one first electronic building block laterally connected to the multi-direction connectable electronic module through the lateral pin connector.

* * * * *